United States Patent
Nishiwaki et al.

(10) Patent No.: US 11,908,912 B2
(45) Date of Patent: Feb. 20, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsuya Nishiwaki, Yokohama (JP); Tsuyoshi Kachi, Kanazawa (JP); Shuhei Tokuyama, Kanazawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 70 days.

(21) Appl. No.: 17/651,484

(22) Filed: Feb. 17, 2022

(65) Prior Publication Data
US 2023/0087505 A1 Mar. 23, 2023

(30) Foreign Application Priority Data
Sep. 10, 2021 (JP) ................................ 2021-147906

(51) Int. Cl.
*H01L 29/423* (2006.01)
*H01L 29/78* (2006.01)
(Continued)

(52) U.S. Cl.
CPC ........ *H01L 29/4238* (2013.01); *H01L 29/401* (2013.01); *H01L 29/404* (2013.01);
(Continued)

(58) Field of Classification Search
CPC . H01L 29/4238; H01L 29/401; H01L 29/404; H01L 29/407; H01L 29/41741;
(Continued)

(56) References Cited

U.S. PATENT DOCUMENTS 9,698,220 B2 7/2017 Hirakata
10,707,312 B2 * 7/2020 Matsuba ........... H01L 29/66734
(Continued)

FOREIGN PATENT DOCUMENTS

| CN | 110911491 A | 3/2020 |
| JP | 2015-99845 A | 5/2015 |

(Continued)

*Primary Examiner* — Shahed Ahmed
*Assistant Examiner* — Khatib A Rahman
(74) *Attorney, Agent, or Firm* — Allen & Overy LLP

(57) ABSTRACT

A semiconductor device includes: a first electrode; a first semiconductor layer; a first insulating film extending downward from an upper surface of the first semiconductor layer, the first insulating film being columnar; a second electrode located in the first insulating film, the second electrode extending in a vertical direction, the second electrode being columnar; a second semiconductor layer partially provided in an upper layer portion of the first semiconductor layer, the second semiconductor layer being next to the first insulating film with the first semiconductor layer interposed; a third semiconductor layer partially provided in an upper layer portion of the second semiconductor layer; and a third electrode located higher than the upper surface of the first semiconductor layer, the third electrode overlapping a portion of the first insulating film, a portion of the first semiconductor layer, and a portion of the second semiconductor layer when viewed from above.

9 Claims, 19 Drawing Sheets

(51) Int. Cl.
*H01L 29/40* (2006.01)
*H01L 29/66* (2006.01)
*H01L 29/417* (2006.01)
*H01L 29/51* (2006.01)
*H01L 29/06* (2006.01)

(52) U.S. Cl.
CPC ...... *H01L 29/407* (2013.01); *H01L 29/41741* (2013.01); *H01L 29/66712* (2013.01); *H01L 29/7811* (2013.01); *H01L 29/7813* (2013.01); *H01L 29/0696* (2013.01); *H01L 29/515* (2013.01)

(58) Field of Classification Search
CPC ........... H01L 29/66712; H01L 29/7811; H01L 29/7813; H01L 29/0696; H01L 29/515; H01L 29/41766; H01L 29/42376
See application file for complete search history.

(56) References Cited

U.S. PATENT DOCUMENTS

| | | | |
|---|---|---|---|
| 11,101,383 B2* | 8/2021 | Nishiwaki | H01L 29/7813 |
| 2006/0145230 A1* | 7/2006 | Omura | H01L 29/0634 |
| | | | 257/E29.066 |
| 2017/0062604 A1* | 3/2017 | Katou | H01L 29/7813 |
| 2017/0263768 A1* | 9/2017 | Katoh | H01L 29/0696 |
| 2020/0266293 A1* | 8/2020 | Katou | H01L 29/4238 |
| 2021/0057574 A1 | 2/2021 | Nishiwaki et al. | |
| 2022/0320288 A1* | 10/2022 | Agata | H01L 29/36 |

FOREIGN PATENT DOCUMENTS

| | | |
|---|---|---|
| JP | 2019-165182 A | 9/2019 |
| JP | 2021-34540 A | 3/2021 |
| JP | 6980626 B2 | 12/2021 |

* cited by examiner

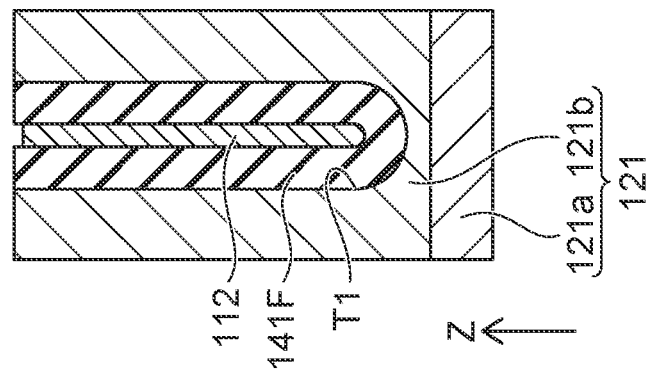
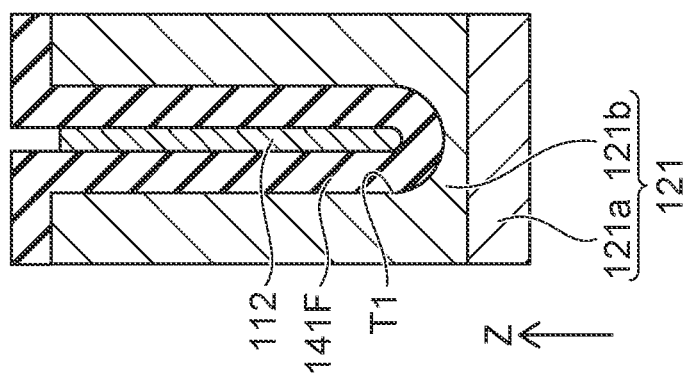
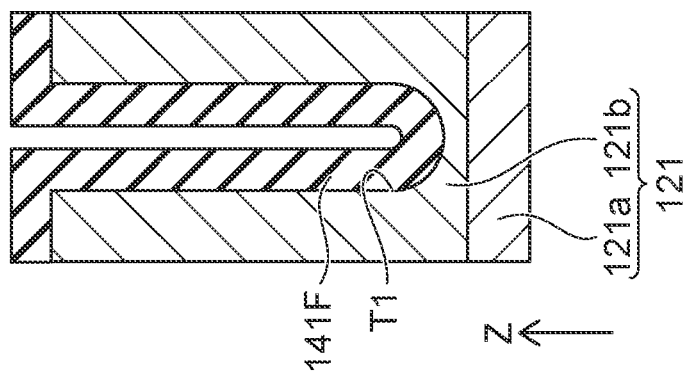
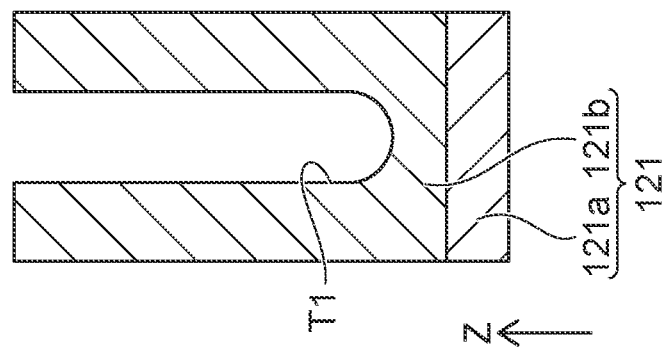

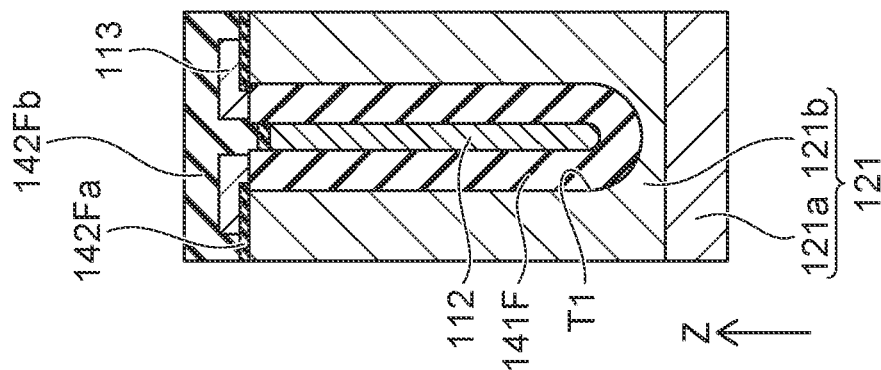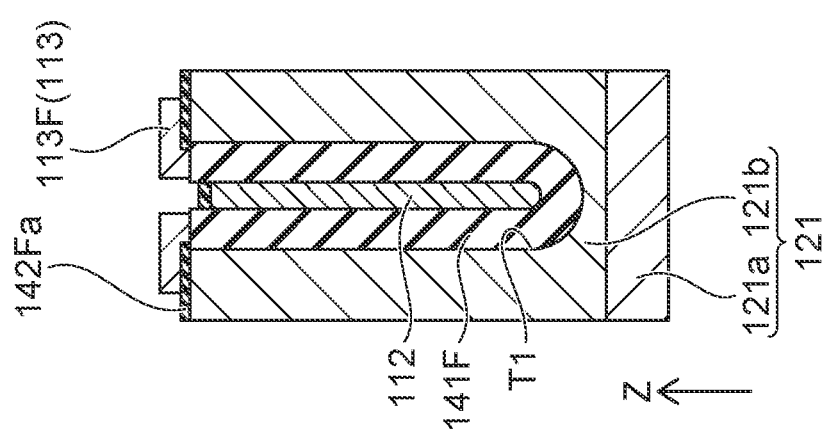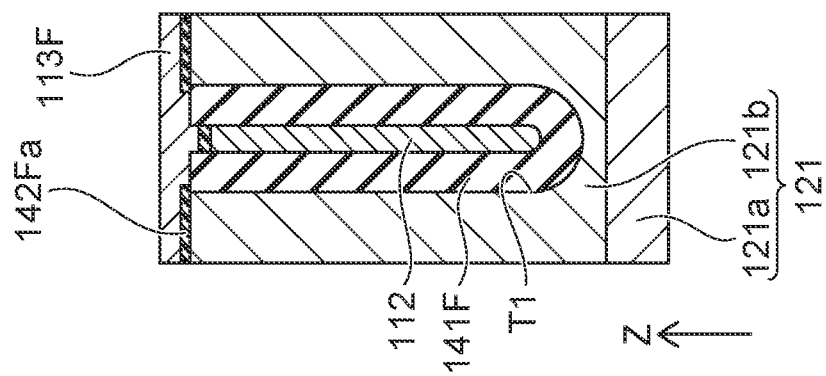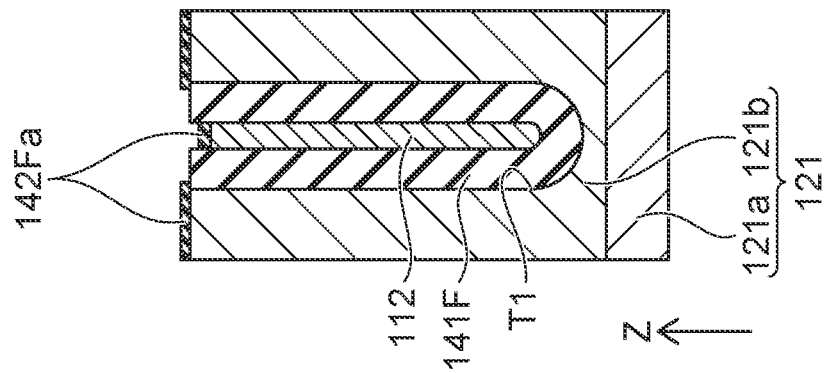

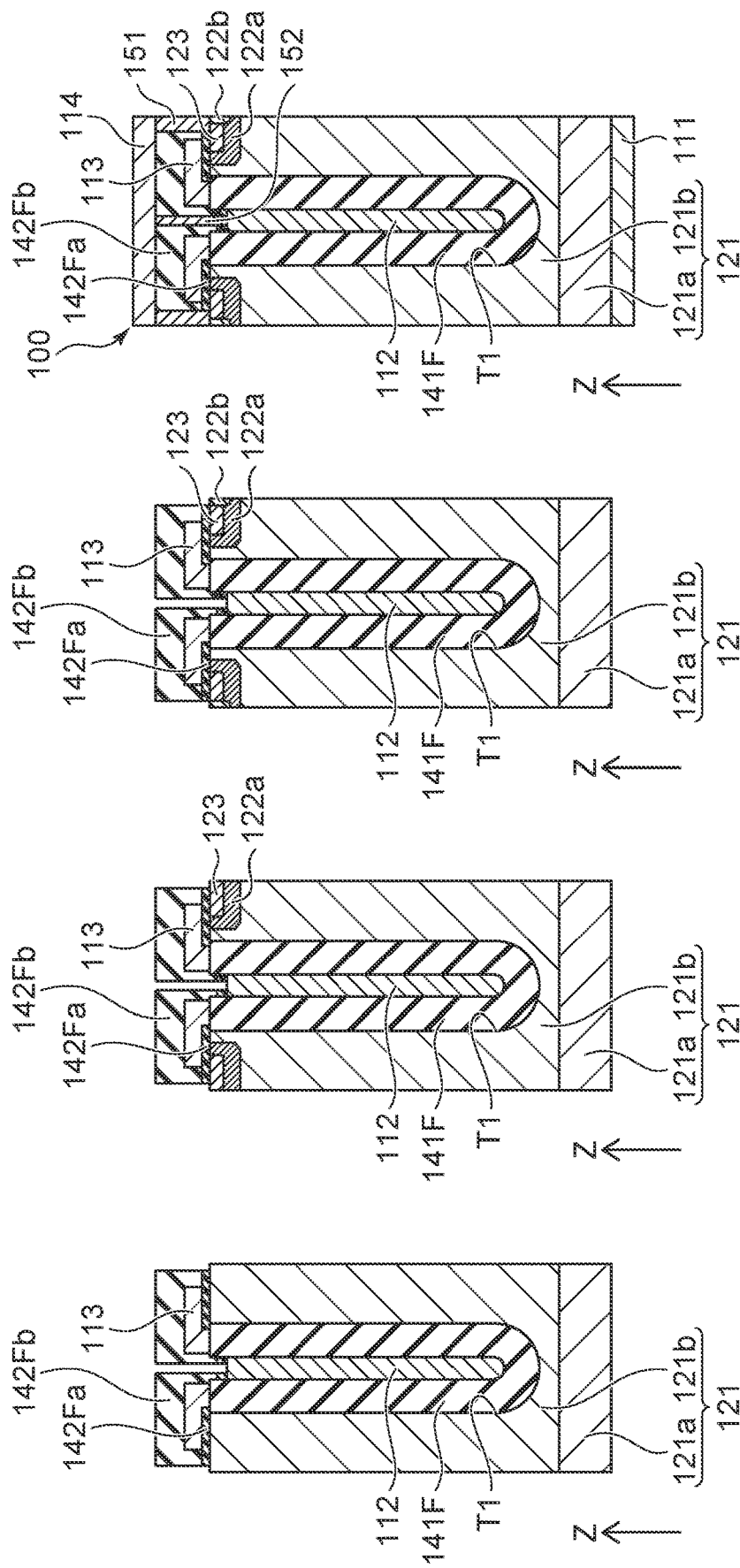

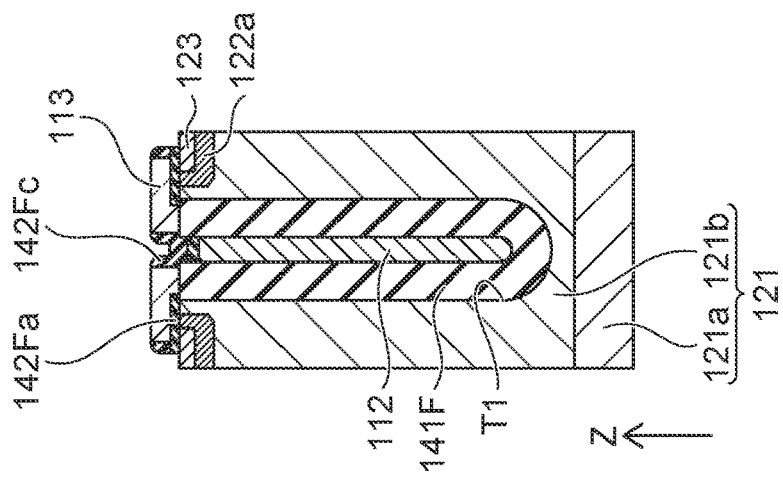
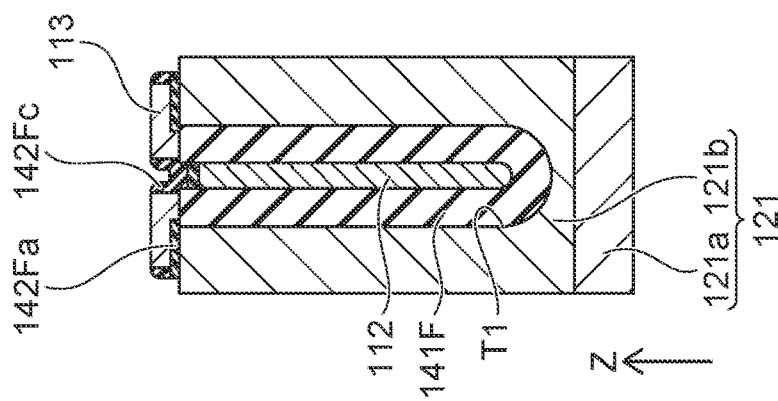
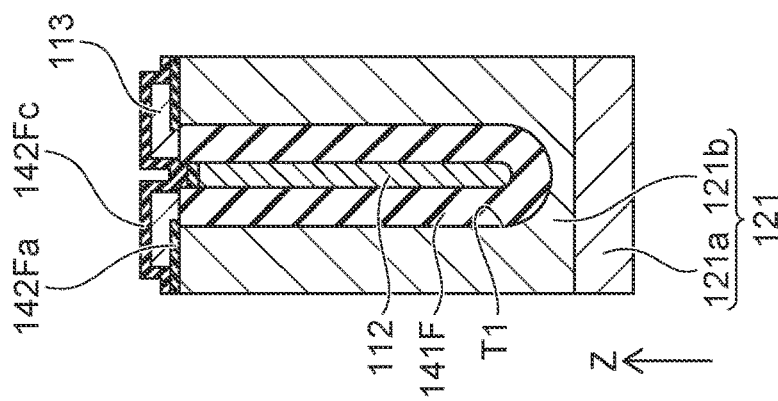
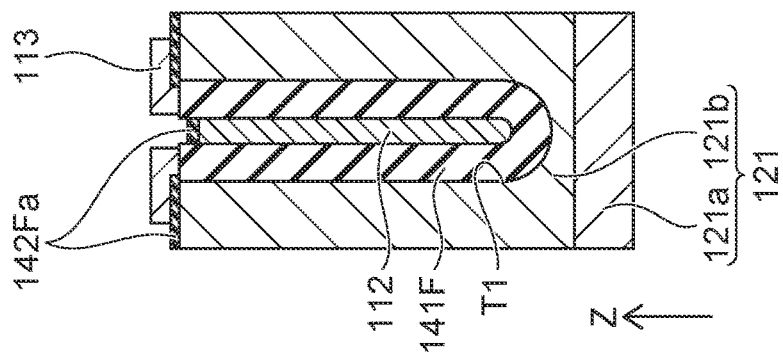

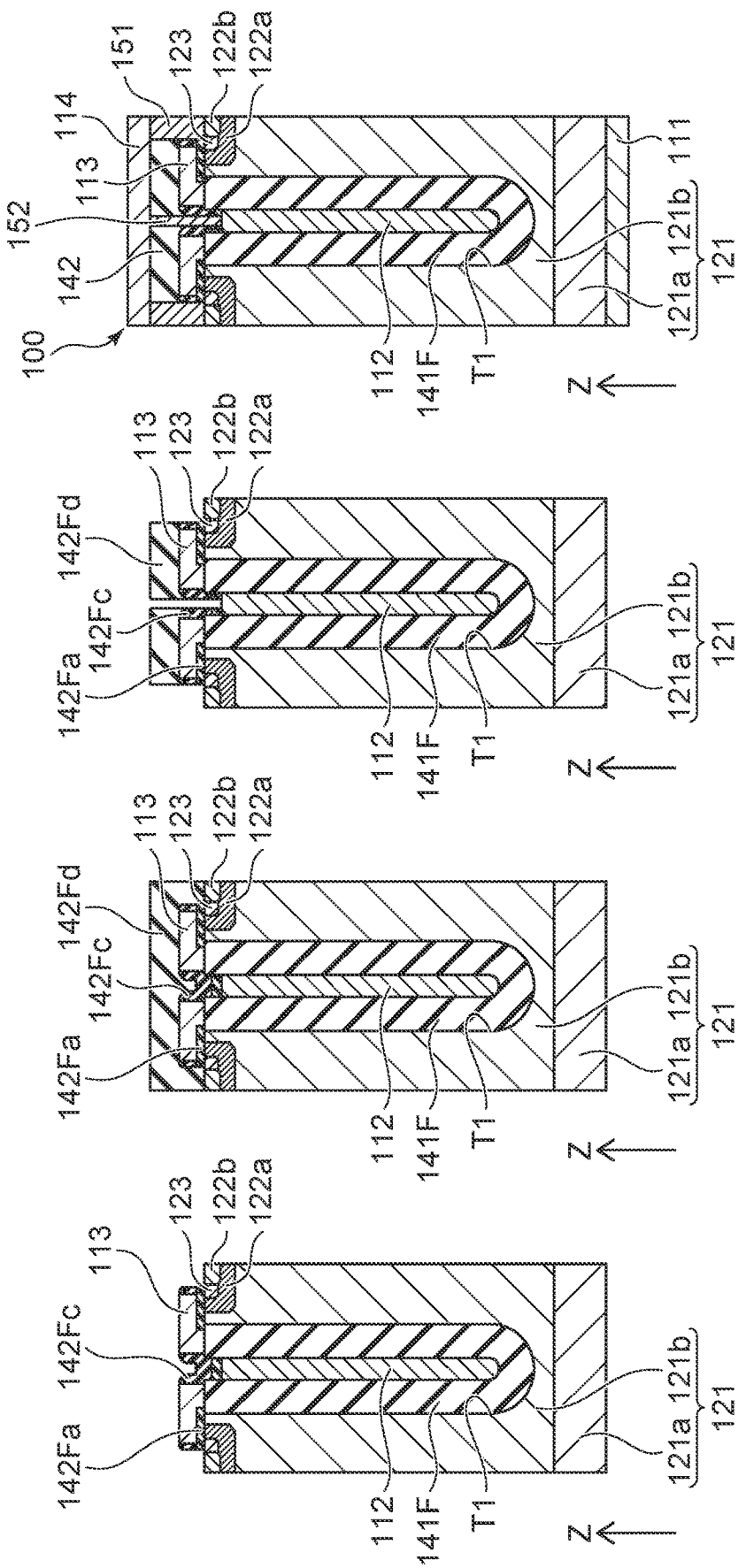

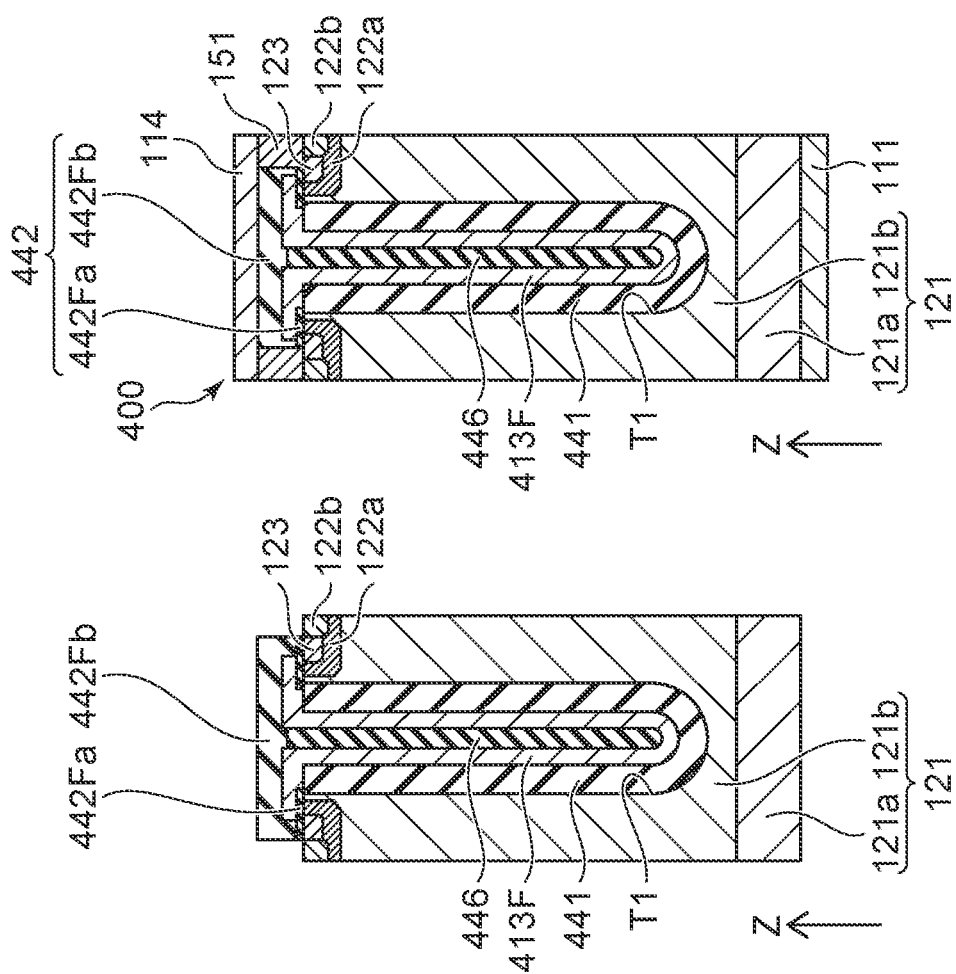

SEMICONDUCTOR DEVICE

CROSS-REFERENCE TO RELATED APPLICATIONS

This application is based upon and claims the benefit of priority from Japanese Patent Application No. 2021-147906, filed on Sep. 10, 2021; the entire contents of which are incorporated herein by reference.

FIELD

Embodiments relate to a semiconductor device.

BACKGROUND

A MOSFET (Metal Oxide Semiconductor Field Effect Transistor) that includes a FP (Field Plate) electrode is conventionally known.

BRIEF DESCRIPTION OF THE DRAWINGS

FIG. 5A is a cross-sectional view showing an example of a method for manufacturing the semiconductor device according to the first embodiment;

FIG. 5B is a cross-sectional view showing the example of the method for manufacturing a semiconductor device according to the first embodiment;

FIG. 5C is a cross-sectional view showing the example of the method for manufacturing the semiconductor device according to the first embodiment;

FIG. 5D is a cross-sectional view showing the example of the method for manufacturing the semiconductor device according to the first embodiment;

FIG. 6A is a cross-sectional view showing the example of the method for manufacturing the semiconductor device according to the first embodiment;

FIG. 6B is a cross-sectional view showing the example of the method for manufacturing the semiconductor device according to the first embodiment;

FIG. 6C is a cross-sectional view showing the example of the method for manufacturing the semiconductor device according to the first embodiment;

FIG. 6D is a cross-sectional view showing the example of the method for manufacturing the semiconductor device according to the first embodiment;

FIG. 7A is a cross-sectional view showing the example of the method for manufacturing the semiconductor device according to the first embodiment;

FIG. 7B is a cross-sectional view showing the example of the method for manufacturing the semiconductor device according to the first embodiment;

FIG. 7C is a cross-sectional view showing the example of the method for manufacturing the semiconductor device according to the first embodiment;

FIG. 7D is a cross-sectional view showing the example of the method for manufacturing the semiconductor device according to the first embodiment;

FIG. 8A is a cross-sectional view showing the example of the method for manufacturing the semiconductor device according to the first embodiment;

FIG. 8B is a cross-sectional view showing the example of the method for manufacturing the semiconductor device according to the first embodiment;

FIG. 8C is a cross-sectional view showing the example of the method for manufacturing the semiconductor device according to the first embodiment;

FIG. 8D is cross-sectional view showing the example of the method for manufacturing the semiconductor device according to the first embodiment;

FIG. 9A is a cross-sectional view showing the example of the method for manufacturing the semiconductor device according to the first embodiment;

FIG. 9B is a cross-sectional view showing the example of the method for manufacturing the semiconductor device according to the first embodiment;

FIG. 9C is a cross-sectional view showing the example of the method for manufacturing the semiconductor device according to the first embodiment;

FIG. 9D is a cross-sectional view showing the example of the method for manufacturing the semiconductor device according to the first embodiment;

FIG. 16A is a cross-sectional view showing the example of the method for manufacturing the semiconductor device according to the fourth embodiment;

FIG. 16B is a cross-sectional view showing the example of the method for manufacturing the semiconductor device according to the fourth embodiment;

DETAILED DESCRIPTION

Figure 1:
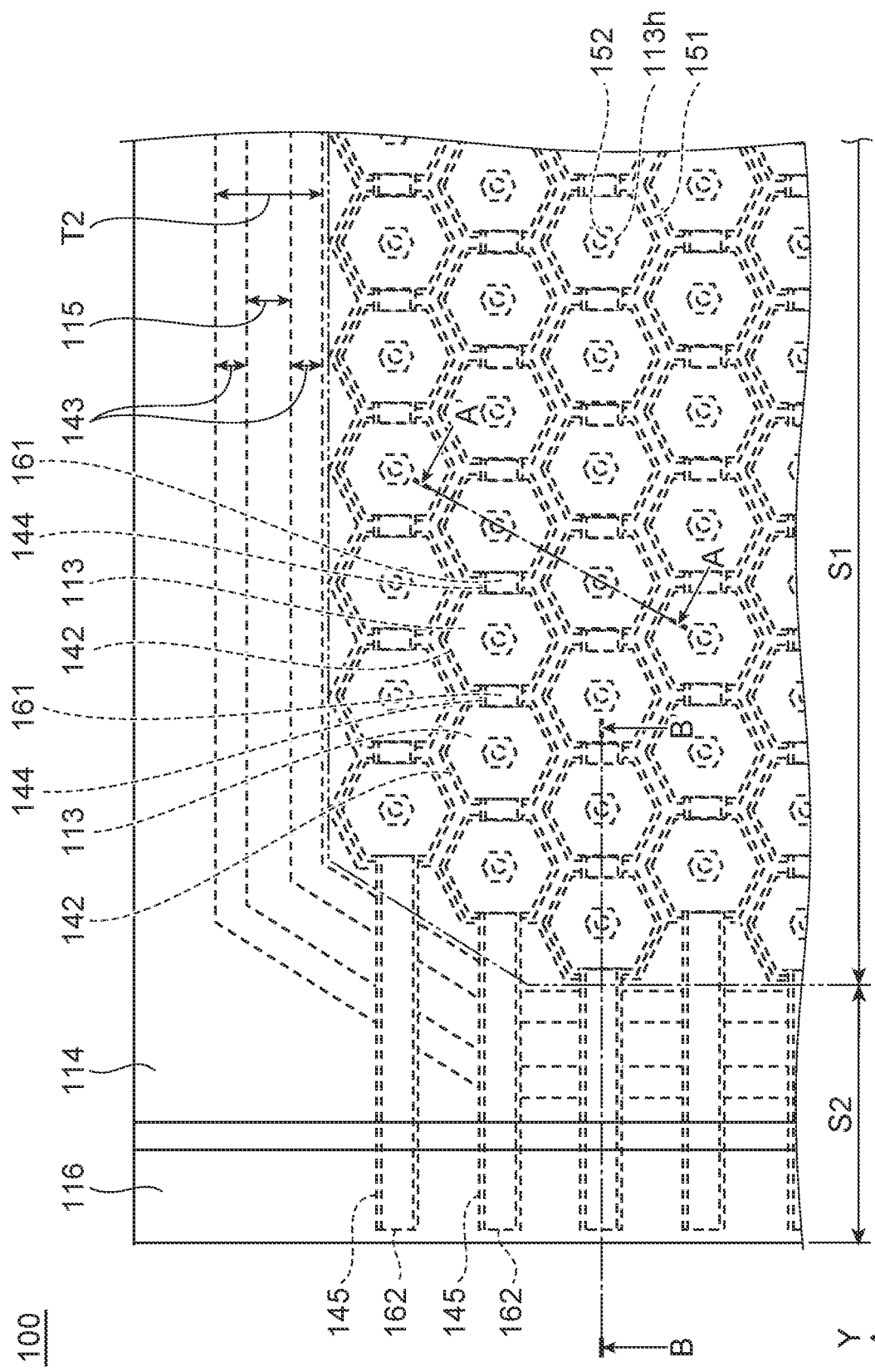
FIG. 1 is a top view showing a portion of a semiconductor device according to a first embodiment.

In general, according to one embodiment, a semiconductor device, includes: a first electrode; a first semiconductor layer located on the first electrode, the first semiconductor layer being of a first conductivity type; a first insulating film extending downward from an upper surface of the first semiconductor layer, the first insulating film being columnar; a second electrode located in the first insulating film, the second electrode extending in a vertical direction, the second electrode being columnar; a second semiconductor layer partially provided in an upper layer portion of the first semiconductor layer, the second semiconductor layer being next to the first insulating film with the first semiconductor layer interposed, the second semiconductor layer being of a second conductivity type; a third semiconductor layer partially provided in an upper layer portion of the second semiconductor layer, the third semiconductor layer being of the first conductivity type; a third electrode located higher than the upper surface of the first semiconductor layer, the third electrode overlapping a portion of the first insulating film, a portion of the first semiconductor layer, and a portion of the second semiconductor layer when viewed from above; a fourth electrode located higher than an upper end of the third electrode, the fourth electrode being electrically connected to the second electrode and the third semiconductor layer; and a second insulating film located between the third electrode and the fourth electrode, between the third electrode and the first semiconductor layer, and between the third electrode and the second semiconductor layer.

In general, according to one embodiment, a semiconductor device, includes: a first electrode; a first semiconductor layer located on the first electrode, the first semiconductor layer being of a first conductivity type; a first insulating film extending downward from an upper surface of the first semiconductor layer, the first insulating film being columnar; a second semiconductor layer partially provided in an upper layer portion of the first semiconductor layer, the second semiconductor layer being next to the first insulating film with the first semiconductor layer interposed, the second semiconductor layer being of a second conductivity type; a third semiconductor layer partially provided in an upper layer portion of the second semiconductor layer, the third semiconductor layer being of the first conductivity type; a second electrode extending in a vertical direction, the second electrode including a first portion, the first portion being columnar, the first portion including an upper end portion that is not covered with the first insulating film, the first portion including a lower end portion that is located in the first insulating film, and a second portion linked to the upper end portion of the first portion, the second portion overlapping a portion of the first semiconductor layer and a portion of the second semiconductor layer when viewed from above; a third electrode located higher than an upper end of the second portion, the third electrode being electrically connected to the third semiconductor layer; and a second insulating film located between the second portion and the third electrode, between the second portion and the first semiconductor layer, and between the second portion and the second semiconductor layer.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

For easier understanding of the following description, the arrangements and configurations of the portions are described using an XYZ orthogonal coordinate system. An X-axis, a Y-axis, and a Z-axis are orthogonal to each other. The direction in which the X-axis extends is taken as an "X-direction"; the direction in which the Y-axis extends is taken as a "Y-direction"; and the direction in which the Z-axis extends is taken as a "Z-direction". Although the direction of the arrow in the Z-direction is taken as up and the opposite direction is taken as down for easier understanding of the description, these directions are independent of the direction of gravity.

Hereinbelow, the notations of + and − indicate relative levels of the impurity concentrations of each conductivity type. Specifically, a notation marked with "+" indicates a relatively higher impurity concentration than a notation marked with "−". Here, when both an impurity that forms donors and an impurity that forms acceptors are included in each region, the "impurity concentration" means the net impurity concentration after the impurities cancel.

First Embodiment

First, a first embodiment will be described.

FIG. 1 is a top view showing a portion of a semiconductor device according to the embodiment.

Figure 2:
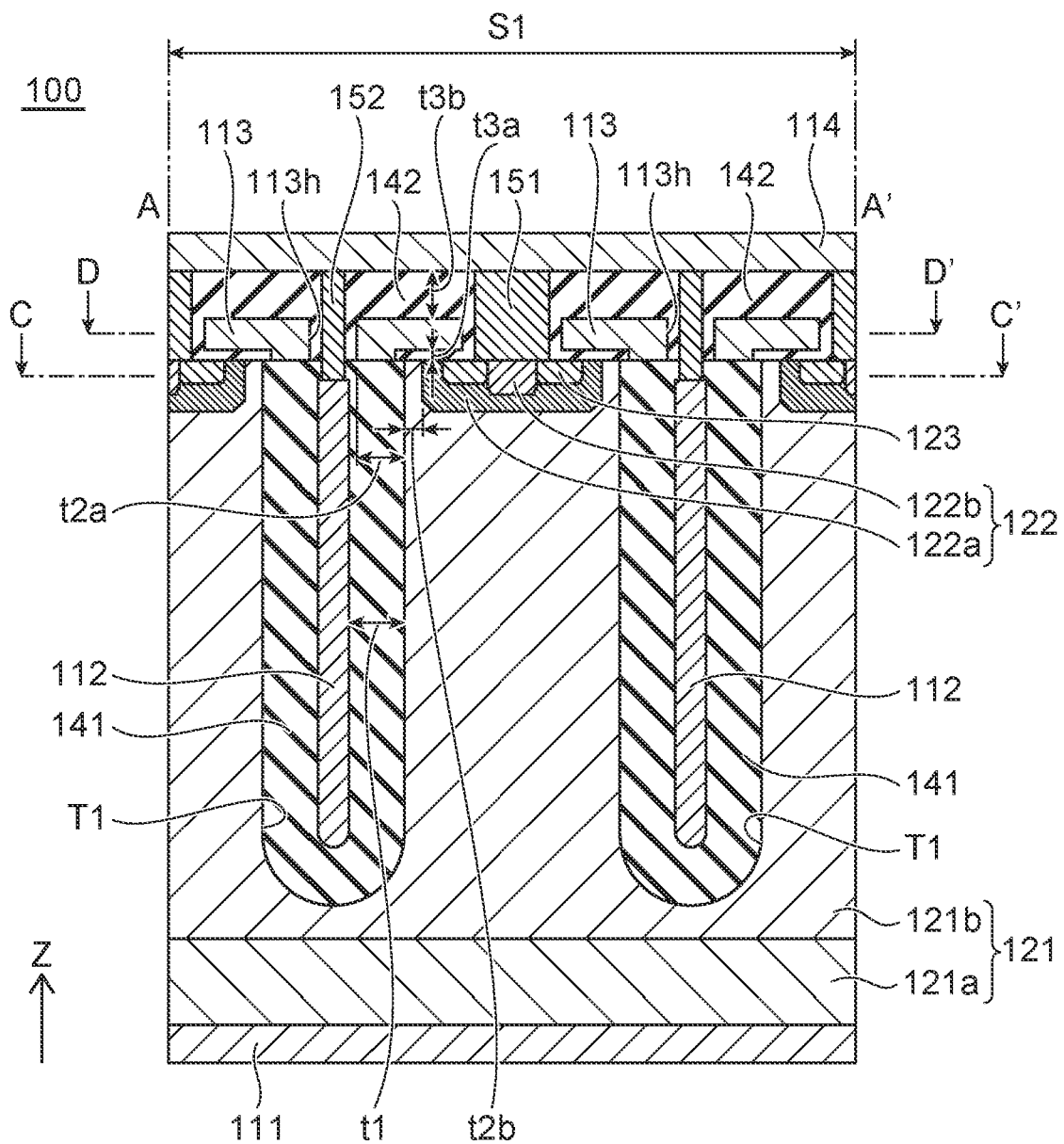
FIG. 2 is a cross-sectional view along line A-A' of FIG. 1.

FIG. 2 is a cross-sectional view along line A-A' of FIG. 1.

Figure 3:
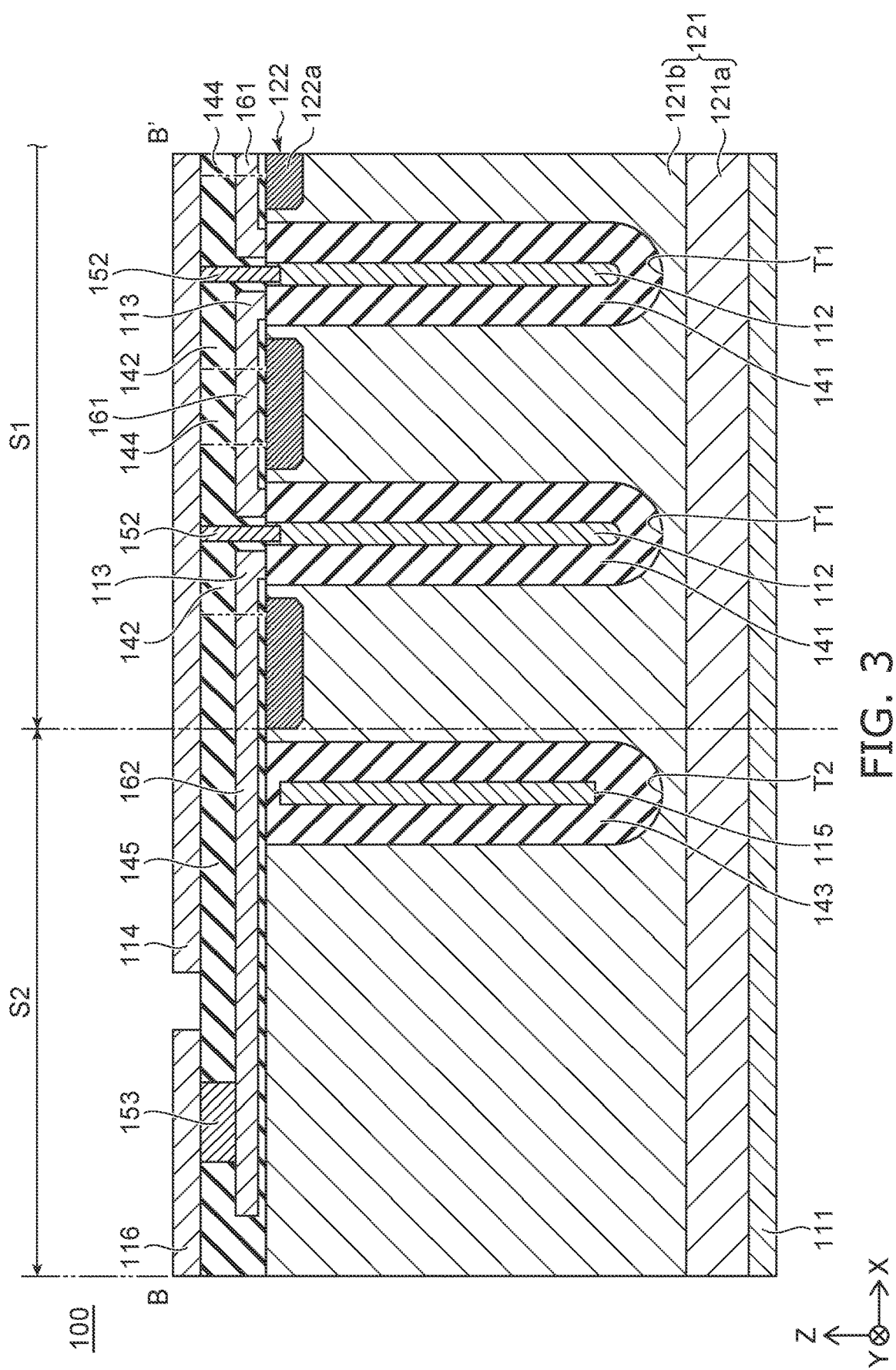
FIG. 3 is a cross-sectional view along line B-B' of FIG. 1.

FIG. 3 is a cross-sectional view along line B-B' of FIG. 1.

Figure 4A:
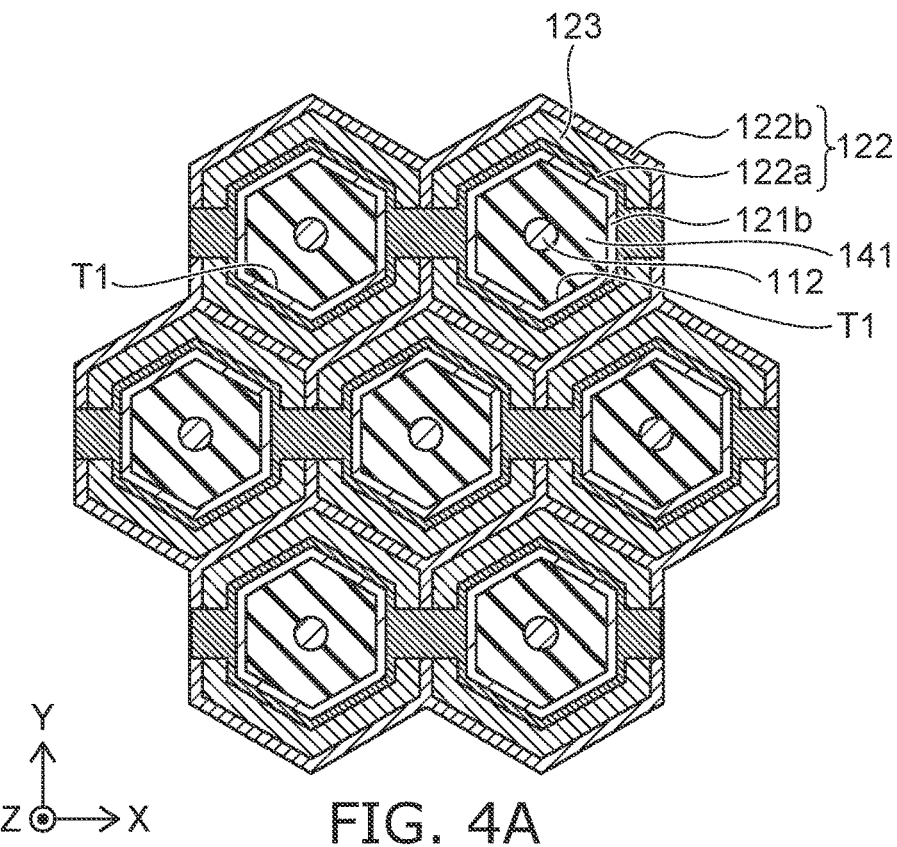
FIG. 4A is a cross-sectional view along line C-C' of FIG. 2.
Figure 4B:
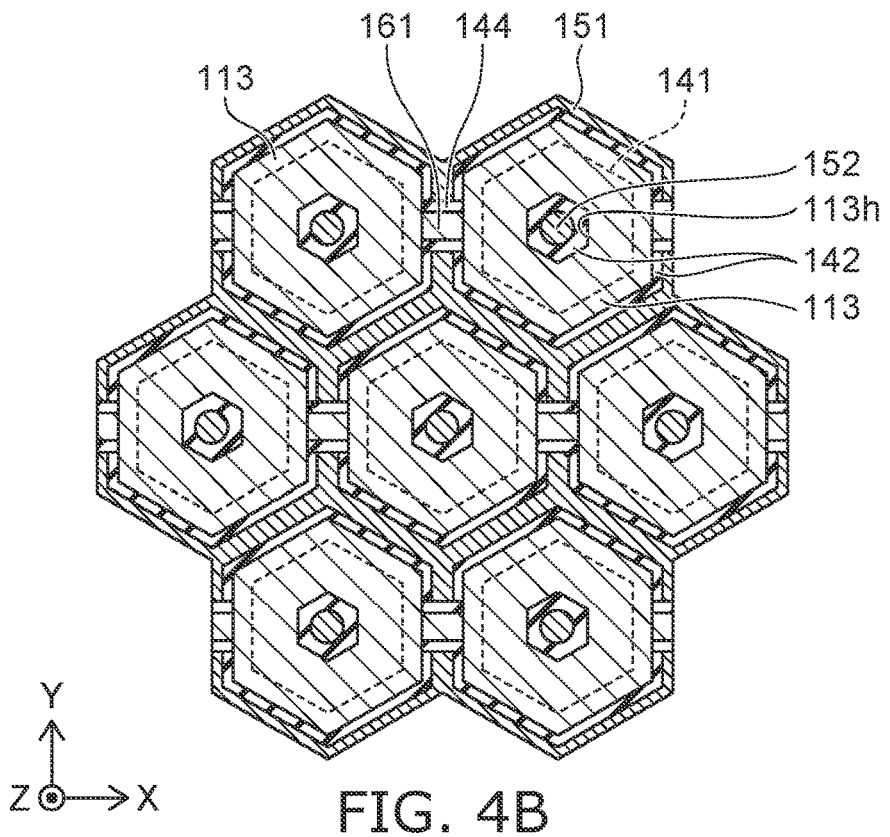
FIG. 4B is a cross-sectional view along line D-D' of FIG. 2.

FIG. 4A is a cross-sectional view along line C-C' of FIG. 2; and FIG. 4B is a cross-sectional view along line D-D' of FIG. 2.

The semiconductor device 100 according to the embodiment is, for example, a high breakdown voltage MOSFET of which the breakdown voltage is not less than 150 V and not more than 400 V. However, the breakdown voltage of the semiconductor device is not limited to that described above. As shown in FIG. 1, an element region S1 and a termination region S2 that surrounds the element region S1 when viewed from above are set in the semiconductor device 100. In FIG. 1, the element region S1 is inward of the double dot-dash line; and the termination region S2 is outward of the double dot-dash line. The termination region S2 corresponds to the outer perimeter region of the semiconductor device 100.

Generally speaking, as shown in FIG. 2, the semiconductor device 100 includes a drain electrode 111, an n-type semiconductor layer 121, a p-type semiconductor layer 122, an n+-type source layer 123, multiple FP electrodes 112, multiple FP insulating films 141, multiple gate electrodes 113, a conductive member 151, multiple conductive members 152, multiple insulating films 142, and a source electrode 114. The components of the semiconductor device 100 will now be elaborated.

The drain electrode 111 is located in substantially the entire region of the lower surface of the semiconductor device 100. In other words, as shown in FIG. 3, the drain electrode 111 is located from the element region S1 to the termination region S2. The upper surface and the lower surface of the drain electrode 111 are substantially parallel to the XY plane. The drain electrode 111 is made of a conductive material such as a metal material, etc.

As shown in FIG. 2, the n-type semiconductor layer 121 includes, for example, an n+-type drain region 121a located on the drain electrode 111, and an n⁻-type drift region 121b located on the n⁺-type drain region 121a. The n⁺-type drain region 121a and the n⁻-type drift region 121b are located from the element region S1 to the termination region S2. The impurity concentration of the n⁻-type drift region 121b is less than the impurity concentration of the n⁺-type drain region 121a.

Multiple trenches T1 that extend downward from the upper surface of the n-type semiconductor layer 121 are provided in the n-type semiconductor layer 121. The multiple trenches T1 are located in the element region S1. Each trench T1 is columnar. Thus, the semiconductor device 100 is a MOSFET having a so-called dot structure in which the trenches T1 are columnar. The lower end of each trench T1 is positioned higher than the n⁺-type drain region 121a. When viewed from above, the shape of each trench T1 is, for example, hexagonal as shown in FIG. 4A. However, the shape of each trench when viewed from above may be another shape such as polygonal other than hexagonal, polygonal with rounded corners, circular, elliptical, etc. The multiple trenches T1 are arranged in a staggered configuration when viewed from above.

Also, as shown in FIG. 3, a trench T2 that extends downward from the upper surface of the termination region S2 of the n-type semiconductor layer 121 is provided in the n-type semiconductor layer 121. The lower end of the trench T2 is positioned higher than the n⁺-type drain region 121a. The shape of the trench T2 when viewed from above is a frame shape that surrounds the element region S1 as shown in FIG. 1.

As shown in FIG. 2, the FP electrodes 112 are respectively provided in the trenches T1. Each FP electrode 112 has a columnar shape extending in the Z-direction, i.e., the vertical direction. When viewed from above, the FP electrodes 112 are positioned at substantially the centers of the trenches T1 as shown in FIG. 4A. The shape of each FP electrode 112 when viewed from above is, for example, circular. However, the shape of each FP electrode when viewed from above may be polygonal such as hexagonal or the like, polygonal with rounded corners, elliptical, etc. As shown in FIG. 2, the upper surface of each FP electrode 112 is positioned lower than the upper surface of the n⁻-type drift region 121b. However, the upper surface of the FP electrode may be coplanar with the upper surface of the n⁻-type drift region. The FP electrodes 112 are made of a conductive material such as polysilicon, a metal material, etc.

The FP insulating films 141 are located in the trenches T1, and are positioned between the n-type semiconductor layer 121 and the FP electrodes 112. Accordingly, each FP insulating film 141 is columnar and extends downward from the upper surface of the n⁻-type drift region 121b. The lower end of each FP insulating film 141 is positioned higher than the n+-type drain region 121a. The shape of the outer perimeter of each FP insulating film 141 when viewed from above is a shape that corresponds to each trench in which the FP electrode is located, and is, for example, hexagonal as shown in FIG. 4A. At least a portion of the upper surface of each FP electrode 112 is not covered with the FP insulating film 141. The FP insulating films 141 are made of an insulating material such as silicon oxide, silicon nitride, etc.

As shown in FIG. 2, the p-type semiconductor layer 122 is partially provided in the upper layer portion of the n⁻-type drift region 121b in the element region S1. The p-type semiconductor layer 122 includes a p⁻-type base region 122a, and a p⁺-type contact region 122b that is partially provided in the upper layer portion of the p⁻-type base region 122a. The impurity concentration of the p⁺-type contact region 122b is greater than the impurity concentration of the p⁻-type base region 122a.

The p⁻-type base region 122a is next to the FP insulating film 141 with the n⁻-type drift region 121b interposed. When viewed from above as shown in FIG. 4A, the p⁻-type base region 122a continuously surrounds the FP insulating films 141 with the n⁻-type drift region 121b interposed.

As shown in FIG. 2, the n⁺-type source layer 123 is partially provided in the upper layer portion of the p-type semiconductor layer 122. When viewed from above as shown in FIGS. 4A and 4B, the n⁺-type source layer 123 discontinuously surrounds the FP insulating films 141 with the p⁻-type base region 122a and the n⁻-type drift region 121b interposed, other than directly under wiring members 161 and wiring insulating films 144 that are described below. Thus, in the specification, "surrounding" includes not only continuously surrounding but also discontinuously surrounding.

Similarly, when viewed from above, the p⁺-type contact region 122b discontinuously surrounds the FP insulating films 141 with the n⁺-type source layer 123, the p⁻-type base region 122a, and the n⁻-type drift region 121b interposed, other than directly under the wiring members 161 and the wiring insulating films 144 that are described below. However, the n⁺-type source layer and the p⁺-type contact region may continuously surround the FP insulating films.

As shown in FIG. 2, the p⁻-type base region 122a also is located below the n⁺-type source layer 123 and the p⁺-type contact region 122b. Accordingly, the portions of the p⁻-type base region 122a that surround the FP insulating films 141 are linked to each other via the portion of the p⁻-type base region 122a located below the p⁺-type contact region 122b. Accordingly, the shape of the p⁻-type base region 122a when viewed from above is a honeycomb mesh shape. However, the regions in which the p⁻-type base region, the p⁺-type contact region, and the n⁺-type source layer are located are not limited to those described above.

According to the embodiment as shown in FIG. 2, the upper surface of the n⁻-type drift region 121b, the upper surfaces of the FP insulating films 141, the upper surface of the p⁻-type base region 122a, the upper surface of the p⁺-type contact region 122b, and the upper surface of the n⁺-type source layer 123 are substantially coplanar.

The n-type semiconductor layer 121, the p-type semiconductor layer 122, and the n⁺-type source layer 123 each include a semiconductor material such as silicon, etc., and impurities corresponding to each layer.

The multiple gate electrodes 113 are located higher than the upper surface of the n⁻-type drift region 121b. In other words, each gate electrode 113 is a planar gate electrode. The shape of each gate electrode 113 is plate-shaped. The shape of the outer perimeter of each gate electrode 113 when viewed from above is, for example, hexagonal as shown in FIG. 4B. However, the shape of the outer perimeter of each gate electrode when viewed from above may be another shape such as polygonal other than hexagonal, polygonal with rounded corners, circular, elliptical, etc. The gate electrodes 113 are made of a conductive material such as polysilicon, a metal material, etc.

When viewed from above, the outer edge of each gate electrode 113 is positioned outward of the outer edge of the FP insulating film 141. As shown in FIG. 2, when viewed from above, each gate electrode 113 overlaps a portion of the FP insulating film 141, a portion of the n⁻-type drift region 121b, a portion of the p⁻-type base region 122a, and a portion of the n⁺-type source layer 123. When the semiconductor device 100 is a high breakdown voltage MOSFET, a thickness t1 of the FP insulating film 141 is, for example, not less than 1 μm and not more than 3 μm; and the thickness t1 of the FP insulating film 141 is large. Therefore, when viewed from above, a width t2a of the overlapping portion of each gate electrode 113 and each FP insulating film 141 can be large. However, the thickness of the FP insulating film is not limited to that described above.

The width t2a of the overlapping portion of each gate electrode 113 and each FP insulating film 141 is greater than a width t2b of the portion of the n-type semiconductor layer 121 positioned between the FP insulating film 141 and the p-type semiconductor layer 122. However, the magnitude relationship of these widths is not limited to that described above.

A through-hole 113h is provided in each gate electrode 113. The through-holes 113h extend through the gate electrodes 113 in the vertical direction. The outer edge of each through-hole 113h when viewed from above is positioned outward of the outer edge of the FP electrode 112. The shape of each through-hole 113h when viewed from above is, for example, hexagonal as shown in FIG. 4B. However, the shape of each through-hole when viewed from above may be another shape such as polygonal other than hexagonal, polygonal with rounded corners, circular, elliptical, etc.

As shown in FIG. 2, a step is provided in the lower surface of each gate electrode 113; a first region of the lower surface of each gate electrode 113 that is adjacent to the through-hole 113h is positioned lower than a second region of the lower surface of each gate electrode 113 that is outward of the first region. However, the lower surface of each gate electrode may be a flat surface that is substantially parallel to the XY plane.

As shown in FIG. 3, the source electrode 114 is located from the element region S1 to the termination region S2. The source electrode 114 is located higher than the upper end of the multiple gate electrodes 113. The source electrode 114 is made of a conductive material such as a metal material, etc.

As shown in FIG. 2, the conductive member 151 electrically connects the source electrode 114 and the n$^+$-type source layer 123. According to the embodiment, the conductive member 151 is positioned between the source electrode 114 and the n$^+$-type source layer 123 and between the source electrode 114 and the p$^+$-type contact region 122b. The lower surface of the conductive member 151 contacts the upper surfaces of the n$^+$-type source layer 123 and the p$^+$-type contact region 122b. The conductive member 151 and the p$^+$-type contact region 122b have an ohmic contact. The upper surface of the conductive member 151 also contacts the source electrode 114. As shown in FIG. 4B, when viewed from above, the conductive member 151 is located between the insulating films 142 that are next to each other, and discontinuously surrounds the insulating films 142 other than portions at which the wiring member 161 and the wiring insulating film 144 described below are located. The conductive member 151 is made of a conductive material such as a metal material, etc.

As shown in FIG. 2, the conductive members 152 electrically connect the source electrode 114 and the FP electrodes 112. Therefore, when using the semiconductor device 100, the FP electrode 112 has substantially the same potential as the potential of the source electrode 114. According to the embodiment, each conductive member 152 passes through the through-hole 113h of the gate electrode 113 from the FP electrode 112 and extends to the source electrode 114. Therefore, the shape of each conductive member 152 is a columnar shape extending in the vertical direction. The shape of each conductive member 152 when viewed from above is, for example, circular as shown in FIG. 4B. However, the shape of each conductive member when viewed from above may be polygonal such as hexagonal, polygonal with rounded corners, elliptical, etc. Each conductive member 152 is made of a conductive material such as a metal material, etc.

As shown in FIG. 2, the insulating films 142 are located between the n$^-$-type drift region 121b and the gate electrodes 113, between the p$^-$-type base region 122a and the gate electrodes 113, and between the n$^+$-type source layer 123 and the gate electrodes 113. The insulating films 142 also are located between the source electrode 114 and the gate electrodes 113, between the conductive member 151 and the gate electrodes 113, and between the gate electrodes 113 and the conductive members 152. A thickness t3a of the portion of each insulating film 142 positioned between the gate electrode 113 and the n$^-$-type drift region 121b is less than a thickness t3b of the portion of each insulating film 142 positioned between the gate electrode 113 and the source electrode 114. However, the magnitude relationship of these thicknesses is not limited to those described above. Each insulating film 142 is made of an insulating material such as silicon oxide, silicon nitride, etc.

The structure of the termination region S2 of the semiconductor device 100 and the connection structure between the gate electrodes 113 will now be described.

As shown in FIGS. 1 and 3, the semiconductor device 100 further includes a termination electrode 115, a termination insulating film 143, the multiple wiring members 161, multiple wiring members 162, a gate wiring member 116, a conductive member 153, the multiple wiring insulating films 144, and multiple wiring insulating films 145.

As shown in FIG. 3, the termination electrode 115 is located in the trench T2. The termination electrode 115 extends in the vertical direction. As shown in FIG. 1, the termination electrode 115 surrounds the element region S1 when viewed from above. When using the semiconductor device 100, for example, the termination electrode 115 is connected to a portion that has a potential between the potential of the drain electrode 111 and the potential of the source electrode 114 in an external circuit (not illustrated) of the semiconductor device 100. The termination electrode 115 is made of a conductive material such as polysilicon, a metal material, etc.

As shown in FIG. 3, the termination insulating film 143 is located in the trench T2. The termination insulating film 143 is located between the termination electrode 115 and the n$^-$-type drift region 121b. As shown in FIG. 1, the termination insulating film 143 surrounds the element region S1 when viewed from above. The termination insulating film 143 is made of an insulating material such as silicon oxide, silicon nitride, etc.

As shown in FIG. 1, the wiring members 161 electrically connect the gate electrodes 113 that are next to each other in the X-direction. As shown in FIG. 3, the wiring members 161 extend in the X-direction and are positioned in the same plane as the gate electrodes 113. The wiring members 161 are made of a conductive material such as polysilicon, a metal material, etc.; and it is favorable for the wiring members 161 to be made of the same material as the gate electrodes 113.

The wiring members 162 extend toward the termination region S2 from the gate electrodes 113 that are most proximate to the termination region S2 in the X-direction. As shown in FIG. 3, the wiring members 162 extend in the X-direction and are positioned in the same plane as the gate electrodes 113. The wiring members 162 are made of a conductive material such as polysilicon, a metal material, etc.; and it is favorable for the wiring members 162 to be made of the same material as the gate electrodes 113.

The gate wiring member 116 is located in the termination region S2. The gate wiring member 116 is separated from the source electrode 114. As shown in FIG. 1, the gate wiring member 116 covers the X-direction end portions of the wiring members 162 when viewed from above. The gate wiring member 116 is made of a conductive material such as a metal material, etc.; and it is favorable for the gate wiring member 116 to be made of the same material as the source electrode 114.

As shown in FIG. 3, the conductive members 153 are positioned between the gate wiring member 116 and the wiring members 162 and electrically connect the gate wiring member 116 and the wiring members 162. Thereby, the multiple gate electrodes 113 are electrically connected to the gate wiring member 116. The conductive members 153 are made of a conductive material such as a metal material, etc.; and it is favorable for the conductive members 153 to be made of a material similar to that of the conductive member 151.

As shown in FIGS. 3 and 4B, the wiring insulating films 144 are located between the source electrode 114 and the wiring members 161, between the p$^-$-type base region 122a and the wiring members 161, and between the conductive member 151 and the wiring members 161. The wiring insulating films 144 are made of an insulating material such as silicon oxide, silicon nitride, etc.

As shown in FIG. 3, the wiring insulating films 145 are located between the source electrode 114 and the wiring members 162, between the n$^-$-type drift region 121b and the wiring members 162, between the p$^-$-type base region 122a and the wiring members 162, and between the termination insulating film 143 and the wiring members 162. The wiring insulating films 145 are made of an insulating material such as silicon oxide, silicon nitride, etc.

One example of a method for manufacturing the semiconductor device 100 according to the embodiment will now be described.

FIGS. 5A to 5D are cross-sectional views showing the example of the method for manufacturing the semiconductor device according to the embodiment.

FIGS. 6A to 6D are cross-sectional views showing the example of the method for manufacturing the semiconductor device according to the embodiment.

FIGS. 7A to 7D are cross-sectional views showing the example of the method for manufacturing the semiconductor device according to the embodiment.

First, as shown in FIG. 5A, the n-type semiconductor layer 121 that includes the n$^+$-type drain region 121a and the n$^-$-type drift region is formed. Then, the multiple trenches T1 are formed in the n-type semiconductor layer 121. Only one trench T1 and the periphery of the one trench T1 are illustrated in the drawings of the manufacturing method.

Then, as shown in FIG. 5B, an insulating film 141F that covers the upper surface of the n-type semiconductor layer 121 and the inner surfaces of the trenches T1 is formed by, for example, thermal oxidation or CVD (Chemical Vapor Deposition). The portion of the insulating film 141F that is positioned in each trench T1 has a bottomed tubular shape with an opening at the top.

Continuing as shown in FIG. 5C, the FP electrode 112 that is made of, for example, polysilicon is formed in the internal space of the portion of the insulating film 141F that is positioned in each trench T1.

Then, as shown in FIG. 5D, the portion of the insulating film 141F that is positioned on the upper surface of the n-type semiconductor layer 121 is removed by, for example, etching such as wet etching or the like, or CMP (chemical mechanical polishing).

Continuing as shown in FIG. 6A, an insulating film 142Fa is formed on the FP electrode 112 and the upper surface of the n-type semiconductor layer 121 by, for example, thermal oxidation. However, the insulating film 142Fa may be formed by CVD.

Then, as shown in FIG. 6B, a conductive member 113F that is made of, for example, polysilicon is formed on the insulating films 142Fa and 141F.

Continuing as shown in FIG. 6C, for example, lithography and etching such as RIE (Reactive Ion Etching), CDE (Chemical Dry Etching), etc., are performed to remove the portion of the conductive member 113F positioned between the trenches T1 that are next to each other when viewed from above and the portion of the conductive member 113F positioned directly above each FP electrode 112. The portion of the remaining portion of the conductive member 113F that is positioned directly above one trench T1 and the periphery of the one trench T1 corresponds to one gate electrode 113 of the semiconductor device 100.

Then, as shown in FIG. 6D, for example, CVD is used to form an insulating film 142Fb on the gate electrodes 113 and on the portion of the upper surface of the insulating film 142Fa that is not covered with the gate electrodes 113.

Continuing as shown in FIG. 7A, for example, lithography and RIE are performed to remove the portions of the insulating films 142Fa and 142Fb positioned between the gate electrodes 113 that are next to each other when viewed from above and the portions of the insulating films 142Fa and 142Fb positioned directly above the FP electrodes 112. Thereby, an opening that exposes the upper surface of the n-type semiconductor layer 121 and openings that expose the FP electrodes 112 are formed in the insulating films 142Fa and 142Fb.

Then, as shown in FIG. 7B, for example, ion implantation and thermal diffusion are performed to form the p$^-$-type base region 122a and the n$^+$-type source layer 123 to spread in directions along the XY plane from the opening of the insulating films 142Fa and 142Fb that exposes the upper surface of the n-type semiconductor layer 121.

Continuing as shown in FIG. 7C, the p$^+$-type contact region 122b is formed using, for example, ion implantation.

Then, as shown in FIG. 7D, the portions of the insulating films 142Fa and 142Fb that are positioned directly above the n$^+$-type source layer 123 also are removed by, for example, lithography and RIE. Thereby, the n$^+$-type source layer 123 is exposed from under the insulating films 142Fa and 142Fb. The insulating film 141F and the portions of the insulating films 142Fa and 142Fb positioned in the trench T1 correspond to the FP insulating film 141 of FIG. 2. The portions of the insulating films 142Fa and 142Fb that are positioned higher than the upper surface of the n$^-$-type drift region 121b and cover the gate electrodes 113 correspond to the insulating film 142 of FIG. 2.

Continuing, the conductive member 151 that is made of, for example, a metal material and contacts the p$^+$-type contact region 122b and the n$^+$-type source layer 123 is formed, and the multiple conductive members 152 that are made of, for example, a metal material and contact the FP electrodes 112 are formed.

Then, the source electrode 114 that is made of, for example, a metal material is formed on the insulating film 142Fb, the conductive member 151, and the multiple conductive members 152. The drain electrode 111 that is made of a metal material is formed under the n-type semiconductor layer 121.

Thus, the semiconductor device 100 is obtained.

Another example of the method for manufacturing the semiconductor device 100 according to the embodiment will now be described.

FIGS. 8A to 8D are cross-sectional views showing the example of the method for manufacturing the semiconductor device according to the embodiment.

FIGS. 9A to 9D are cross-sectional views showing the example of the method for manufacturing the semiconductor device according to the embodiment.

The manufacturing method of this example is the same as the manufacturing method of the previous example described above up to the process of forming the insulating film 142Fa, that is, up to the process of FIG. 6C.

After the insulating film 142Fa is formed as shown in FIG. 8A, an insulating film 142Fc is formed on the gate electrodes 113 and on the portion of the upper surface of the insulating film 142Fa not covered with the gate electrodes 113 as shown in FIG. 8B.

Then, as shown in FIG. 8C, for example, lithography and RIE are performed to remove the portions of the insulating films 142Fa and 142Fc positioned between the gate electrodes 113 that are next to each other when viewed from above and the portions of the insulating film 142Fc positioned directly above the gate electrodes 113. The portions of the insulating film 142Fc that cover the side surfaces of the gate electrodes 113 remain.

Continuing as shown in FIG. 8D, the p$^-$-type base region 122$a$ and the n$^+$-type source layer 123 are formed by, for example, ion implantation and thermal diffusion.

Then, as shown in FIG. 9A, the p$^+$-type contact region 122$b$ is formed by, for example, ion implantation. Even when each gate electrode 113 has a complex shape such as hexagonal, etc., the misalignment of the n$^+$-type source layer 123 with respect to the gate electrodes 113 can be suppressed because a mesa structure part that includes the p$^-$-type base region 122$a$, the p$^+$-type contact region 122$b$, and the n$^+$-type source layer 123 is formed according to the portions of the insulating film 142Fc that cover the side surfaces of the gate electrodes 113.

Continuing as shown in FIG. 9B, an insulating film 142Fd is formed on the p$^+$-type contact region 122$b$ and the insulating film 142Fc by, for example, CVD.

Then, as shown in FIG. 9C, for example, lithography and RIE are performed to remove the portions of the insulating films 142Fc and 142Fd positioned between the gate electrodes 113 that are next to each other when viewed from above and the portions of the insulating film 142Fa, the insulating film 142Fc, and the insulating film 142Fd positioned directly above the FP electrodes 112. The portions of the insulating film 141F, the insulating film 142Fa, and the insulating film 142Fc positioned in the trenches T1 correspond to the FP insulating films 141. The portions of the insulating film 142Fd, the insulating film 142Fa, and the insulating film 142Fc that are positioned higher than the upper surface of the n$^-$-type drift region 121$b$ and cover the gate electrodes 113 correspond to the insulating film 142 of FIG. 2.

Continuing as shown in FIG. 9D, the conductive member 151 that is made of, for example, a metal material that contacts the p$^+$-type contact region 122$b$ and the n$^+$-type source layer 123 is formed, and the conductive members 152 that are made of, for example, a metal material and contact the FP electrodes 112 is formed.

Then, the source electrode 114 that is made of, for example, a metal material is formed on the insulating film 142, the conductive member 151, and the conductive member 152. The drain electrode 111 that is made of a metal material is formed under the n-type semiconductor layer 121.

Thus, the semiconductor device 100 is obtained.

A method for using the semiconductor device 100 according to the embodiment will now be described.

An n-type inversion layer is generated in the portion of the p$^-$-type base region 122$a$ of the p-type semiconductor layer 122 positioned directly under the gate electrode 113 by applying a potential to the gate electrode 113 that is greater than the potential of the source electrode 114. A current is caused to flow from the n$^+$-type source layer 123 to the n-type semiconductor layer 121 via the inversion layer by applying a potential to the drain electrode 111 that is greater than the potential of the source electrode 114 in this state.

Effects of the semiconductor device 100 according to the embodiment will now be described.

The gate electrode 113 of the semiconductor device 100 according to the embodiment is a planar gate electrode. Thereby, compared to a semiconductor device that includes a trench gate electrode, the surface area of the portion of the n-type semiconductor layer 121 that faces the gate electrode 113 via the insulating film 142 can be reduced in the semiconductor device 100 according to the embodiment. Therefore, the capacitance between the gate electrode 113 and the drain electrode 111 can be reduced. Also, compared to a semiconductor device that includes a trench gate electrode, the overlap amount between the gate electrode 113 and the n$^+$-type source layer 123 can be reduced with good controllability in the semiconductor device 100 according to the embodiment.

The capacitance between the gate electrode 113 and the drain electrode 111 can be reduced even further by the depletion layer that extends downward in the portion of the n-type semiconductor layer 121 positioned directly under the gate electrode 113.

The gate electrode 113 overlaps a portion of the FP insulating film 141. Therefore, the FP insulating film 141 easily shields between the gate electrode 113 and the n-type semiconductor layer 121. As a result, the capacitance between the gate electrode 113 and the drain electrode 111 can be reduced even further.

Thus, by reducing the capacitance between the gate electrode 113 and the drain electrode 111, the semiconductor device 100 can be provided in which high-speed switching is possible.

In a semiconductor device that includes a trench gate electrode, it is necessary to provide a conductive member for connecting the gate electrode located in the trench to a gate wiring member and provide a conductive member for connecting the FP electrode to the source electrode between the source electrode and the trench; and the structure of the semiconductor device becomes complex. Conversely, according to the embodiment, the structure of the semiconductor device 100 can be simple because it is unnecessary to provide a conductive member for connecting the gate electrode 113 to the gate wiring member 116 between the source electrode 114 and the trench T1.

The p-type semiconductor layer 122 and the n$^+$-type source layer 123 surround the FP insulating film 141 with the n-type semiconductor layer 121 interposed. Therefore, the surface area when the p-type semiconductor layer 122 and the n$^+$-type source layer 123 are located in the semiconductor device 100 can be increased.

Second Embodiment

A second embodiment will now be described.

Figure 10:
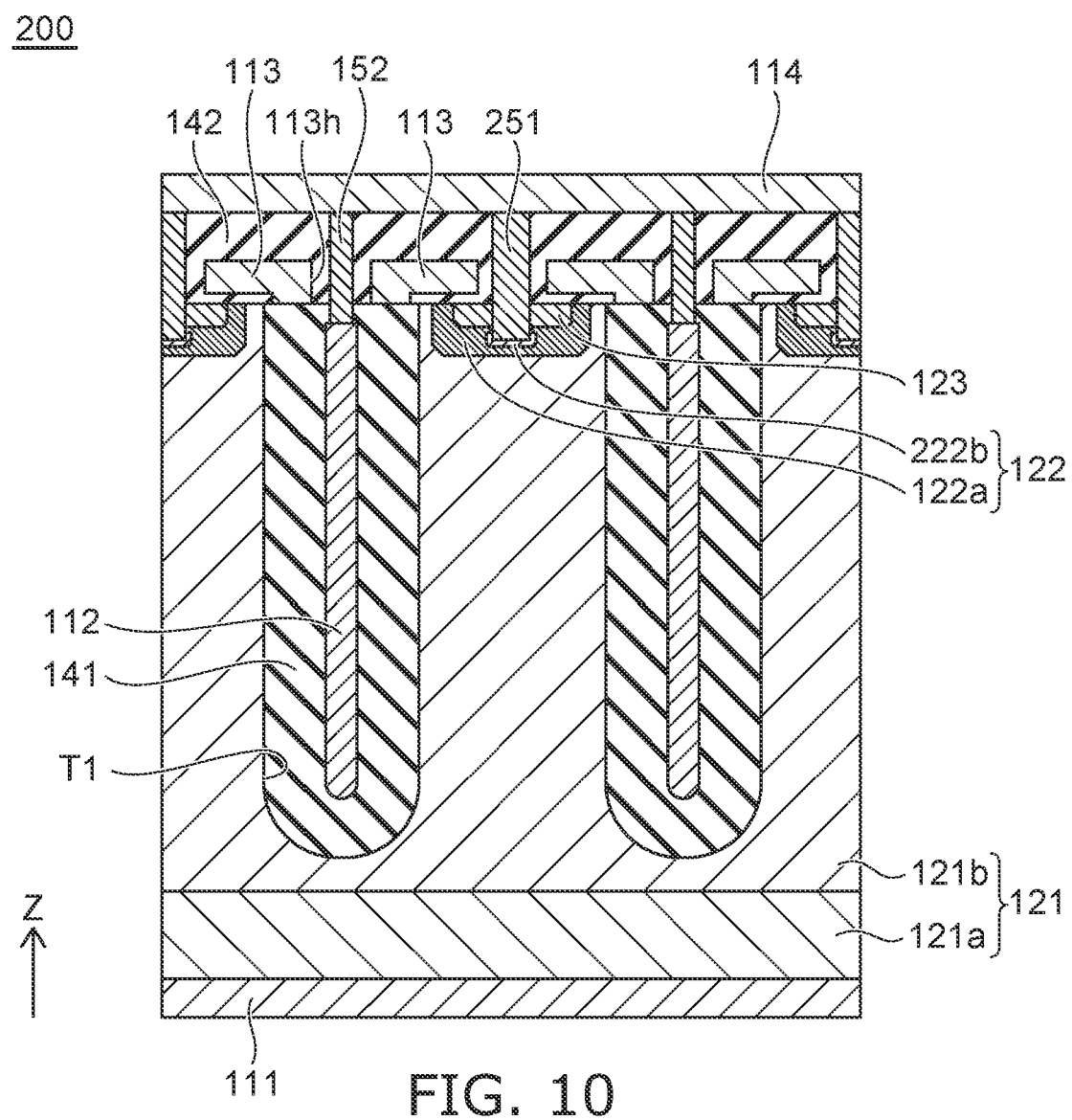
FIG. 10 is a cross-sectional view showing a semiconductor device according to a second embodiment.

FIG. 10 is a cross-sectional view showing a semiconductor device according to the embodiment.

The semiconductor device 200 according to the embodiment differs from the semiconductor device 100 according to the first embodiment in that the lower end of a conductive member 251 that electrically connects the source electrode 114 and the n$^+$-type source layer 123 is positioned lower than the lower surface of the n$^+$-type source layer 123.

As a general rule in the following description, only the differences with the first embodiment are described. Other than the items described below, the embodiment is similar to the first embodiment. This is similar for the other embodiments described below as well.

According to the embodiment, a p$^+$-type contact region 222b is located in the p$^-$-type base region 122a at the periphery of the lower end portion of the conductive member 251, and is lower than the lower surface of the n$^+$-type source layer 123. The side surface of the conductive member 251 contacts the n$^+$-type source layer 123; and the lower end portion of the conductive member 251 contacts the p$^+$-type contact region 222b. Thus, because the lower end of the conductive member 251 is positioned lower than the lower surface of the n$^+$-type source layer 123, it is unnecessary for the p$^+$-type contact region 222b and the n$^+$-type source layer 123 to be next to each other in a direction along the XY plane. Therefore, a mesa structure part that includes the p$^-$-type base region 122a, the p$^+$-type contact region 222b, and the n$^+$-type source layer 123 can be fine.

Third Embodiment

A third embodiment will now be described.

Figure 11:
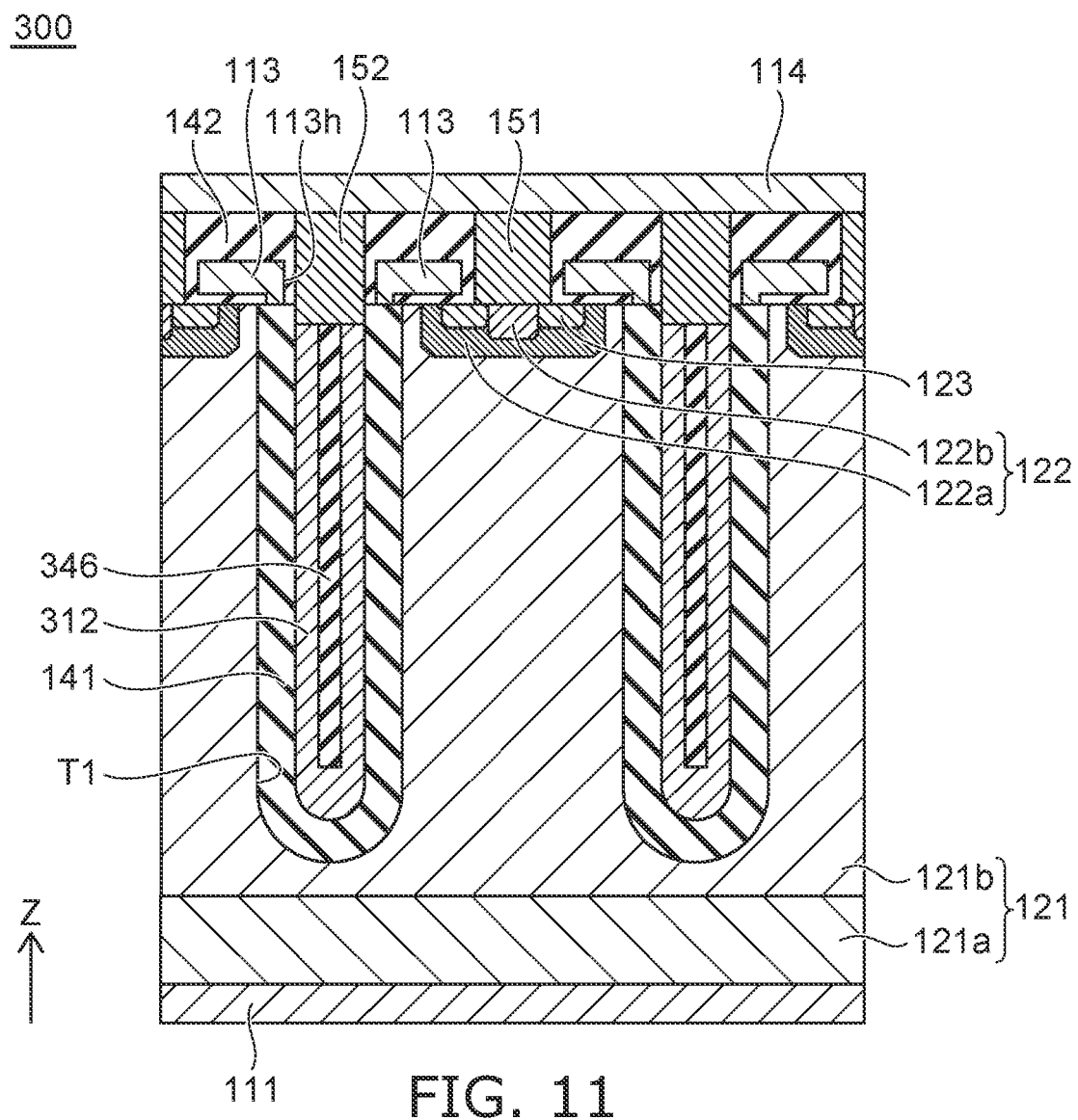
FIG. 11 is a cross-sectional view showing a semiconductor device according to a third embodiment.

FIG. 11 is a cross-sectional view showing a semiconductor device according to the embodiment.

The shape of the FP electrode 312 of the semiconductor device 300 according to the embodiment is different from that of the semiconductor device 100 according to the first embodiment.

The FP electrode 312 has a bottomed tubular shape with an opening at the top. It is easier to form the FP electrode because the thickness of the FP electrode 312 is thin. The semiconductor device 300 according to the embodiment further includes an insulating film 346 that is located in the internal space of the FP electrode 312. However, an air layer may be provided in the internal space of the FP electrode. In such a case, deformation that causes the semiconductor device 300 to warp can be suppressed.

Fourth Embodiment

A fourth embodiment will now be described.

Figure 12:
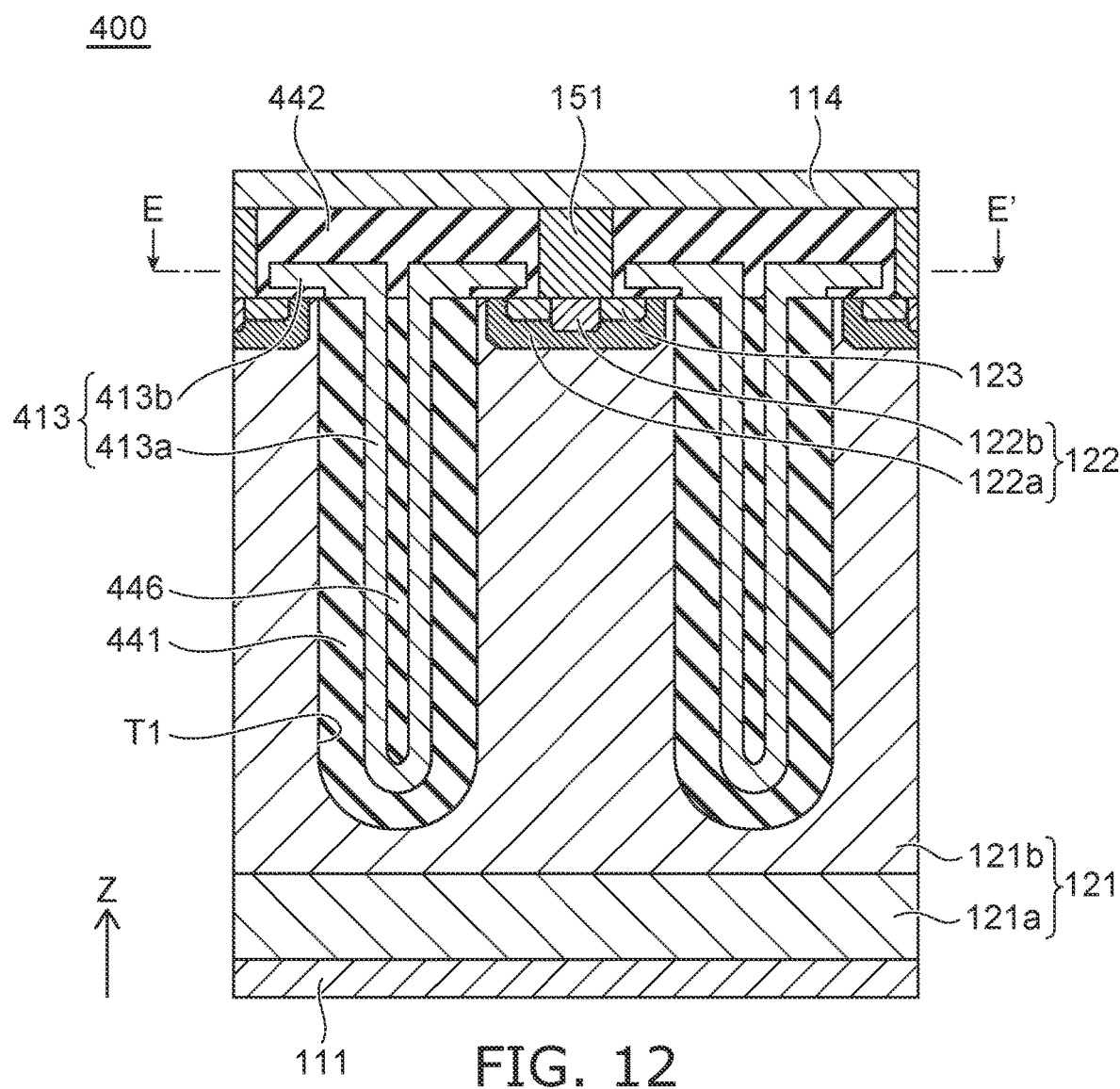
FIG. 12 is a cross-sectional view showing a semiconductor device according to a fourth embodiment.

FIG. 12 is a cross-sectional view showing a semiconductor device according to the embodiment.

Figure 13:
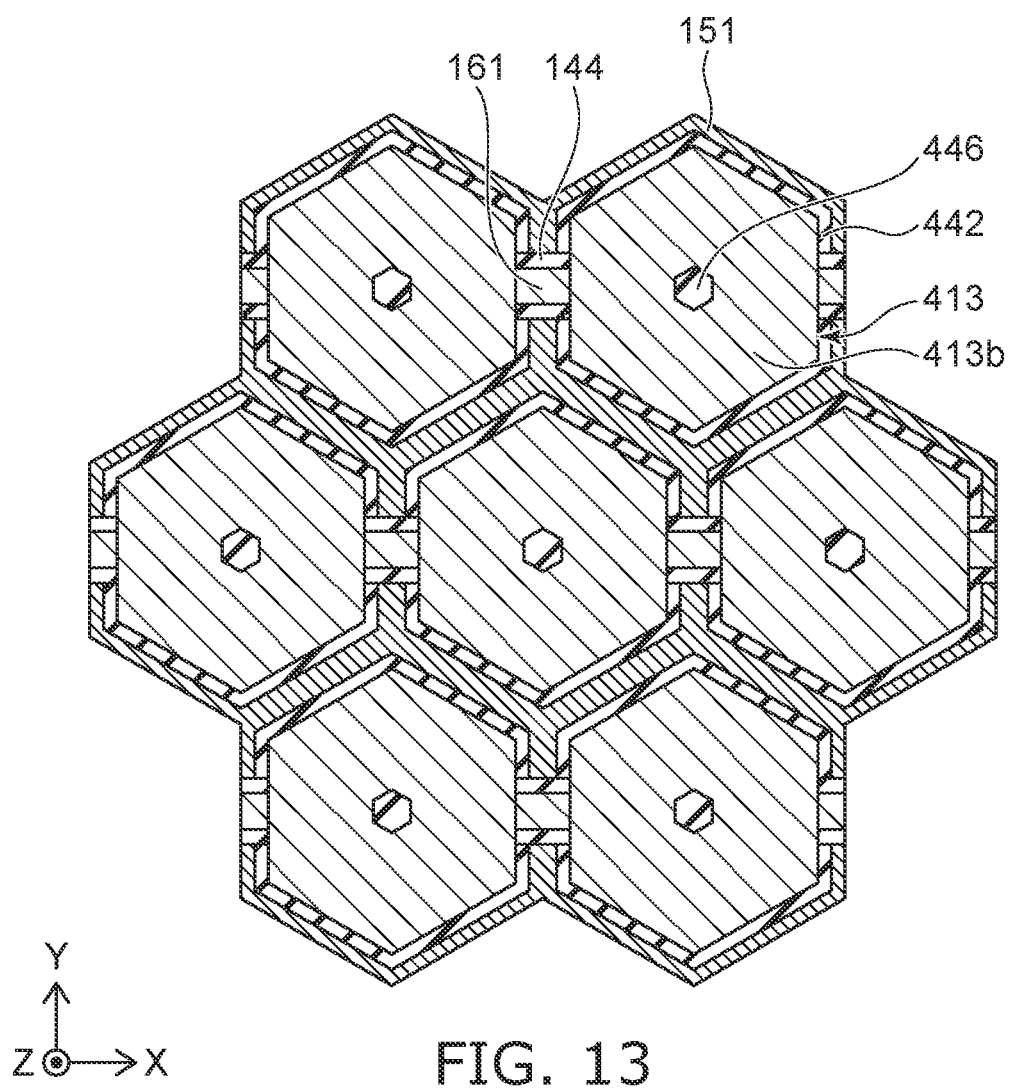
FIG. 13 is a cross-sectional view along line E-E' of FIG. 12.

FIG. 13 is a cross-sectional view along line E-E' of FIG. 12.

The semiconductor device 400 according to the embodiment differs from the semiconductor device 100 according to the first embodiment in that multiple electrodes 413 are included instead of the multiple FP electrodes 112 and the multiple gate electrodes 113.

Each electrode 413 includes a columnar first portion 413a that extends in the vertical direction and includes a lower end portion located in the trench T1 and an upper end portion exposed outside the trench T1, and a second portion 413b that is linked to the upper end portion of the first portion 413a. The electrodes 413 are connected to the gate wiring member 116 similarly to the gate electrodes 113 according to the first embodiment.

According to the embodiment, the first portion 413a has a bottomed tubular shape with an opening at the top. The semiconductor device 400 according to the embodiment further includes an insulating film 446 that is located in the internal space of the first portion 413a. However, an air layer may exist in the internal space of the first portion 413a instead of the insulating film 446. An insulating film 441 is located between the first portion 413a and the n$^-$-type drift region 121b.

According to the embodiment, the second portion 413b is plate-shaped. According to the embodiment, a step is provided in the lower surface of the second portion 413b. However, the lower surface of the second portion may be a flat surface. As shown in FIG. 13, the shape of the outer perimeter of the second portion 413b is hexagonal when viewed from above. As shown in FIG. 12, the second portion 413b overlaps a portion of the insulating film 441, a portion of the n$^-$-type drift region 121b, a portion of the p$^-$-type base region 122a, and a portion of the n$^-$-type source layer 123 when viewed from above. An insulating film 442 is located between the second portion 413b and the n$^-$-type drift region 121b, between the second portion 413b and the p$^-$-type base region 122a, and between the second portion 413b and the n$^+$-type source layer 123. Each insulating film 442 also is located between the second portion 413b and the source electrode 114 and between the second portion 413b and the conductive member 151.

One example of a method for manufacturing the semiconductor device 400 according to the embodiment will now be described.

FIGS. 14A to 14D are cross-sectional views showing the example of the method for manufacturing the semiconductor device according to the embodiment.

FIGS. 15A to 15D are cross-sectional views showing the example of the method for manufacturing the semiconductor device according to the embodiment.

FIGS. 16A and 16B are cross-sectional views showing the example of the method for manufacturing the semiconductor device according to the embodiment.

Figure 14A:
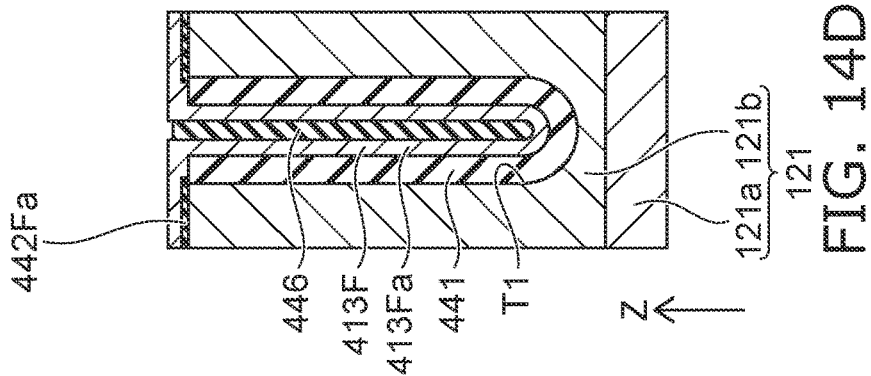
FIG. 14A is a cross-sectional view showing an example of a method for manufacturing the semiconductor device according to the fourth embodiment.

First, as shown in FIG. 14A, the n-type semiconductor layer 121 that includes the n$^+$-type drain region 121a and the n$^-$-type drift region 121b is formed. Then, the multiple trenches T1 are formed in the n-type semiconductor layer 121.

Then, the insulating films 441 that cover the inner surface of the trenches T1 are formed by, for example, thermal oxidation or CVD. Each insulating film 441 has a bottomed tubular shape with an opening at the top.

Figure 14B:
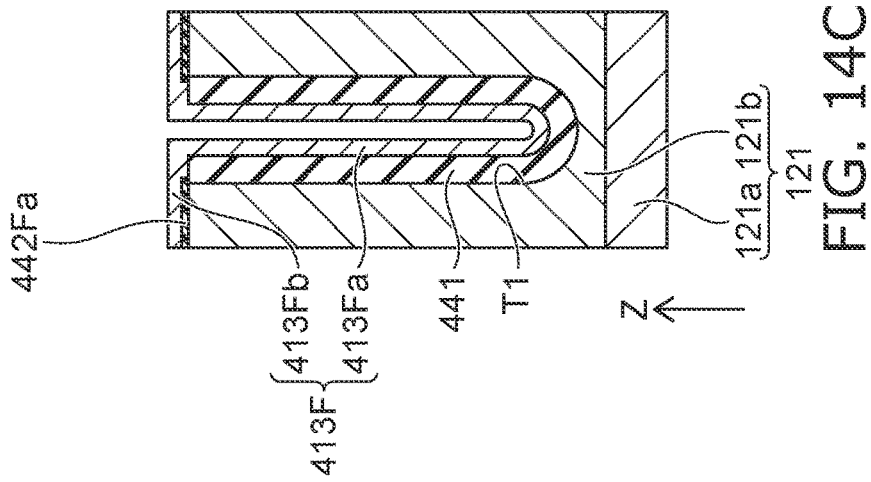
FIG. 14B is a cross-sectional view showing the example of the method for manufacturing the semiconductor device according to the fourth embodiment.

Continuing as shown in FIG. 14B, an insulating film 442Fa is formed by, for example, thermal oxidation on the n$^-$-type drift region 121b.

Figure 14C:
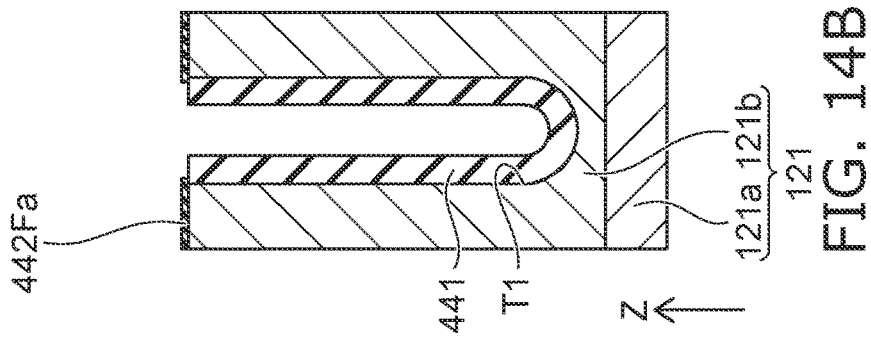
FIG. 14C is a cross-sectional view showing the example of the method for manufacturing the semiconductor device according to the fourth embodiment.

Then, as shown in FIG. 14C, a conductive member 413F that is made of polysilicon and covers the inner surfaces of the insulating films 441 and the upper surface of the insulating film 442Fa is formed. The conductive member 413F includes a first portion 413Fa that includes a lower end portion positioned at each insulating film 441 and an upper end portion not covered with each insulating film 441, and a second portion 413Fb that is linked to the upper end portion of the first portion 413Fa and positioned on the insulating film 442Fa. The first portion 413Fa has a bottomed tubular shape with an opening at the top.

Figure 14D:
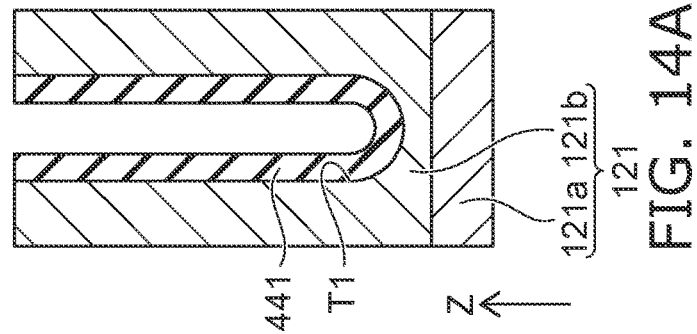
FIG. 14D is a cross-sectional view showing the example of the method for manufacturing the semiconductor device according to the fourth embodiment.

Continuing as shown in FIG. 14D, the insulating film 446 is formed in the internal space of the first portion 413Fa by, for example, CVD.

Figure 15D:
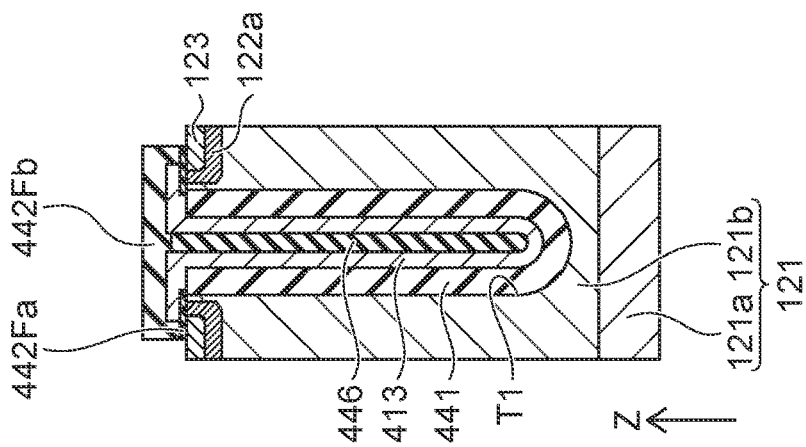
FIG. 15D is a cross-sectional view showing the example of the method for manufacturing the semiconductor device according to the fourth embodiment.
Figure 15C:
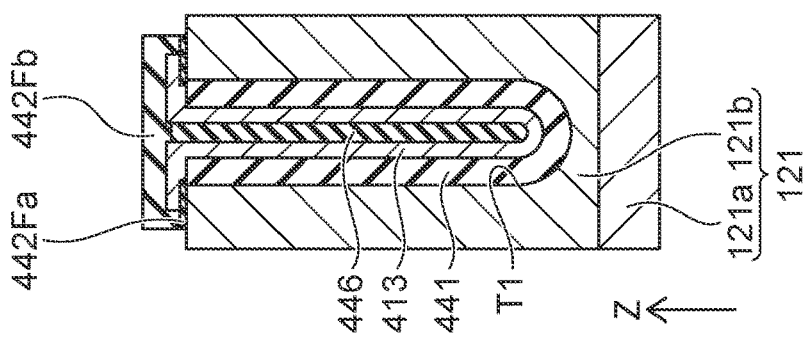
FIG. 15C is a cross-sectional view showing the example of the method for manufacturing the semiconductor device according to the fourth embodiment.
Figure 15B:
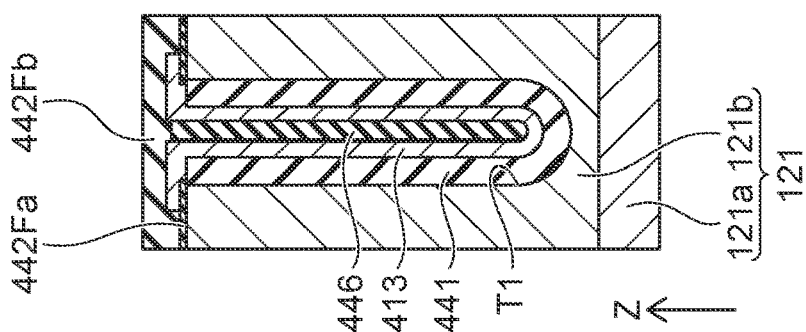
FIG. 15B is a cross-sectional view showing the example of the method for manufacturing the semiconductor device according to the fourth embodiment.
Figure 15A:
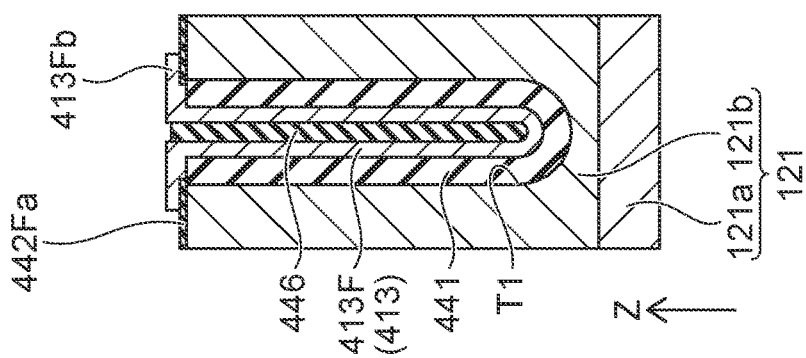
FIG. 15A is a cross-sectional view showing the example of the method for manufacturing the semiconductor device according to the fourth embodiment.

Then, as shown in FIG. 15A, lithography and etching such as RIE, CDE, etc., are performed to remove the portion of the second portion 413Fb positioned between the trenches T1 that are next to each other when viewed from above. The remaining portions of the conductive member 413F, i.e., the portion positioned in one trench T1, the portion positioned directly above the trench T1, and the portion positioned directly above the periphery of the trench T1, correspond to one electrode 413 of the semiconductor device 400.

Continuing as shown in FIG. 15B, for example, CVD is performed to form an insulating film 442Fb on the electrodes 413, on the portion of the upper surface of the insulating film 442Fa not covered with the electrodes 413, and on the insulating films 446.

Then, as shown in FIG. 15C, for example, lithography and RIE are performed to remove the portions of the insulating films 442Fa and 442Fb positioned between the electrodes 413 that are next to each other.

Continuing as shown in FIG. 15D, the p$^-$-type base region 122a and the n$^+$-type source layer 123 are formed by, for example, ion implantation and thermal diffusion.

Then, as shown in FIG. 16A, the p$^+$-type contact region 122b is formed by, for example, ion implantation.

Continuing as shown in FIG. 16B, for example, lithography and RIE are performed further to remove the portions of the insulating films 442Fa and 442Fb positioned directly above the n$^+$-type source layer 123. The portions among the remaining portions of the insulating films 442Fa and 442Fb that cover the electrodes 413 correspond to the insulating films 442 of the semiconductor device 400. Thereby, the n$^+$-type source layer 123 is exposed from under the insulating films 442.

Then, the conductive member 151 that is made of, for example, a metal material that contacts the p$^+$-type contact region 122b and the n$^+$-type source layer 123 is formed.

Continuing, the source electrode 114 that is made of, for example, a metal material is formed on the insulating film 442 and the conductive member 151. The drain electrode 111 that is made of a metal material is formed under the n-type semiconductor layer 121.

Thus, the semiconductor device 400 is obtained.

Effects of the embodiment will now be described.

In the semiconductor device 400 according to the embodiment, the electrode 413 includes the columnar first portion 413a that includes a lower end portion located in the trench T1 and an upper end portion exposed outside the trench T1 to extend in the vertical direction, and the second portion 413b that is linked to the upper end portion of the first portion 413a and overlaps a portion of the n-type semiconductor layer 121, a portion of the p-type semiconductor layer 122, and a portion of the n$^+$-type source layer 123 when viewed from above. By connecting the first portion 413a and the second portion 413b to the gate potential, an n-type accumulation layer is generated in the portion of the n$^-$-type drift region 121b positioned at the vicinity of the insulating film 441 in the on-state of the semiconductor device 400. The on-resistance of the semiconductor device 100 can be reduced thereby. Also, the structure of the semiconductor device 400 can be simple because it is unnecessary to provide a conductive member that electrically connects the second portion 413b and the source electrode 114.

The first portion 413a has a tubular shape with an opening at the upper end. It is easier to form the first portion 413a because the thickness of the first portion 413a is thin. When an air layer is provided inside the first portion 413a, deformation that causes the semiconductor device 400 to warp can be suppressed.

Fifth Embodiment

A fifth embodiment will now be described.

Figure 17:
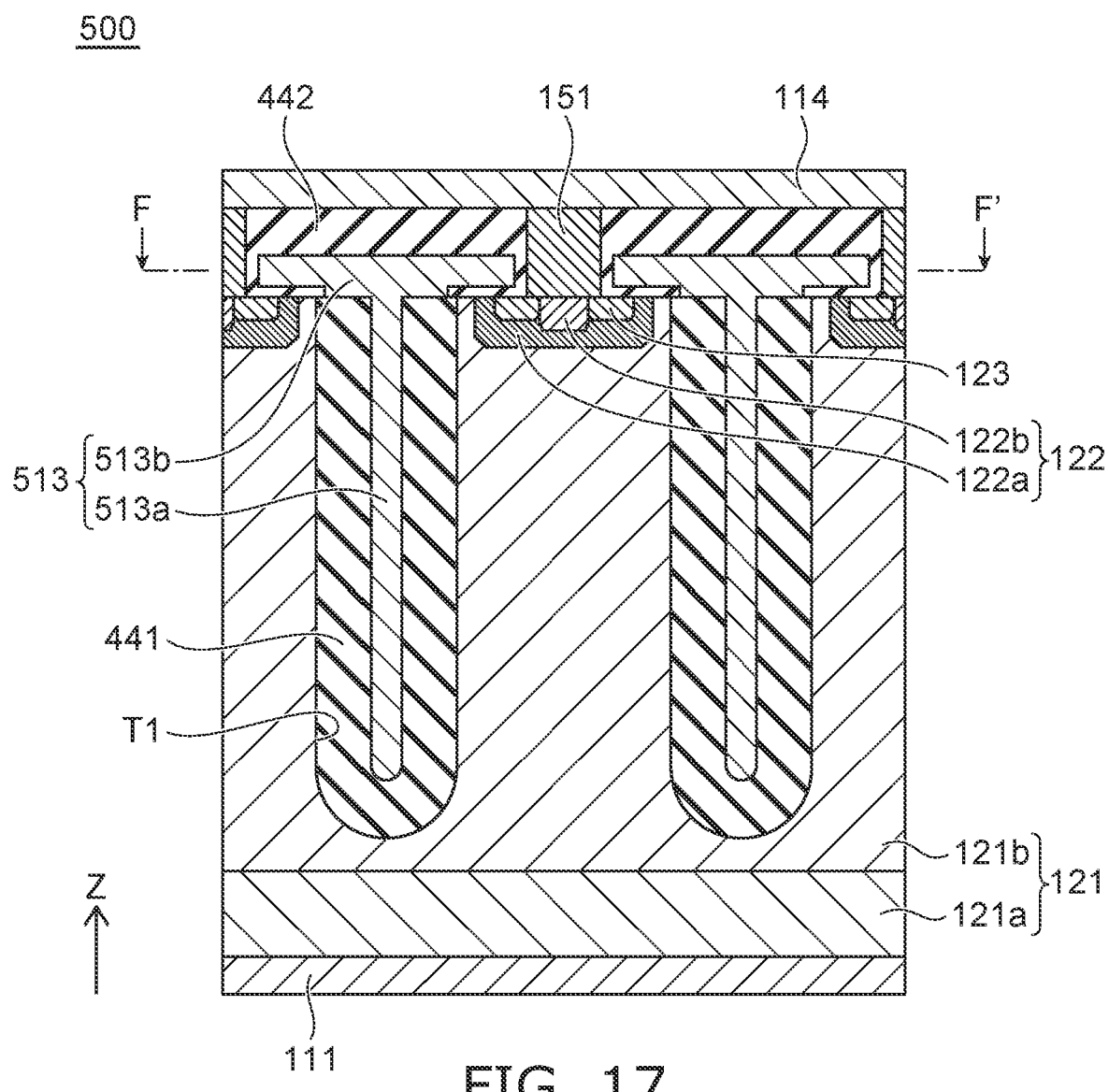
FIG. 17 is a cross-sectional view showing a semiconductor device according to a fifth embodiment.

FIG. 17 is a cross-sectional view showing a semiconductor device according to the embodiment.

Figure 18:
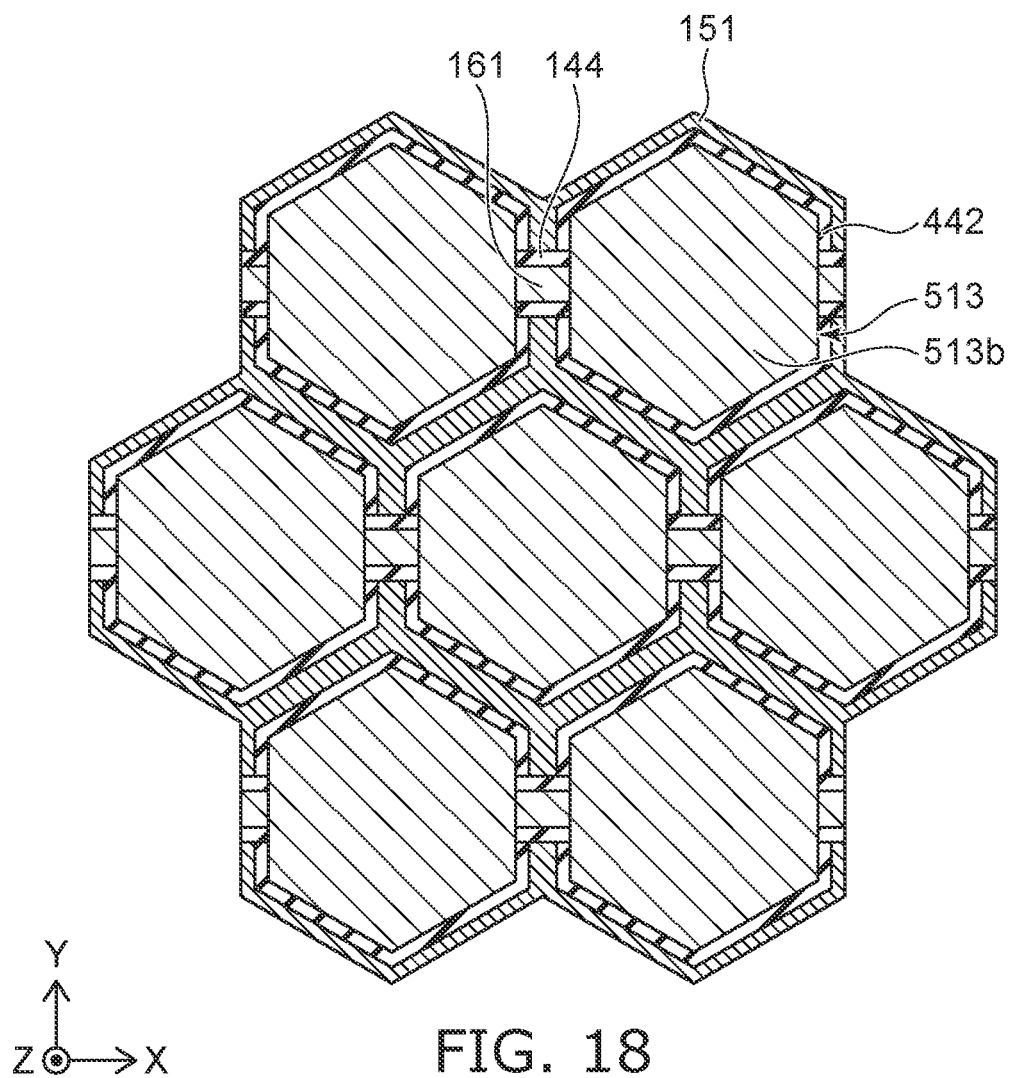
FIG. 18 is a cross-sectional view along line F-F' of FIG. 17.

FIG. 18 is a cross-sectional view along line F-F' of FIG. 17.

As shown in FIG. 17, the semiconductor device 500 according to the embodiment differs from the semiconductor device 400 according to the fourth embodiment in that an electrode 513 includes a first portion 513a that is solid instead of tubular, and a second portion 513b that is linked to the upper end portion of the first portion 513a. Thus, as long as the shape of the first portion 513a is columnar, the shape may not be tubular.

Modification

A modification of the region in which the p$^+$-type contact region 122b and the n$^+$-type source layer 123 are located will now be described.

Figure 19:
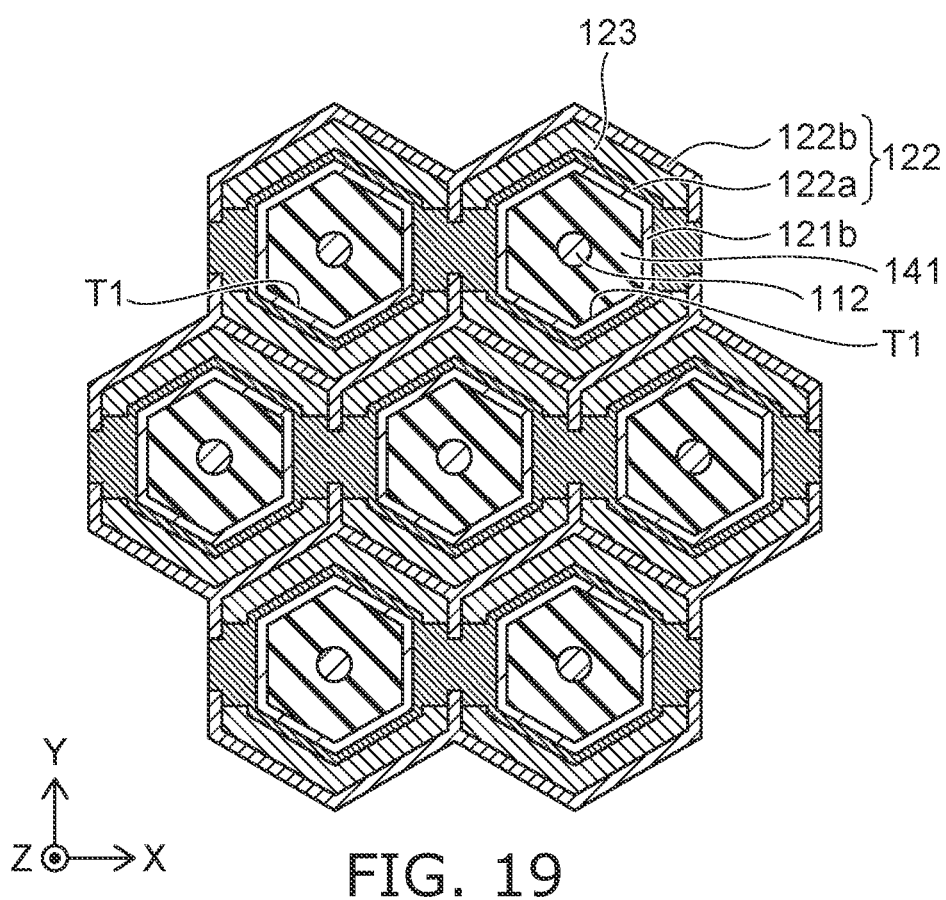
FIG. 19 is a cross-sectional view showing a modification of a region in which a p+-type contact region and a n+-type source layer are provided.

FIG. 19 is a cross-sectional view showing the modification of the region in which the p$^+$-type contact region and the n$^+$-type source layer are provided.

The p$^+$-type contact region 122b juts further in the Y-direction than the n$^+$-type source layer 123 at the portion of the p$^-$-type base region 122a positioned between two trenches T1 next to each other in the X-direction. Thereby, the occurrence of a parasitic bipolar operation in the region in which the n$^+$-type source layer 123 is located can be suppressed. As a result, the avalanche resistance can be improved.

Configurations of multiple embodiments and modifications described above can be combined as appropriate within the extent of technical feasibility. For example, the configuration of the second embodiment and the configuration of the modification of FIG. 19 may be combined with the fourth and fifth embodiments.

Embodiments may include the following configurations (e.g., technological proposals).

Configuration 1

A semiconductor device, comprising:
a first electrode;
a first semiconductor layer located on the first electrode, the first semiconductor layer being of a first conductivity type;
a first insulating film extending downward from an upper surface of the first semiconductor layer, the first insulating film being columnar;
a second electrode located in the first insulating film, the second electrode extending in a vertical direction, the second electrode being columnar;
a second semiconductor layer partially provided in an upper layer portion of the first semiconductor layer, the second semiconductor layer being next to the first insulating film with the first semiconductor layer interposed, the second semiconductor layer being of a second conductivity type;
a third semiconductor layer partially provided in an upper layer portion of the second semiconductor layer, the third semiconductor layer being of the first conductivity type;

a third electrode located higher than the upper surface of the first semiconductor layer, the third electrode overlapping a portion of the first insulating film, a portion of the first semiconductor layer, and a portion of the second semiconductor layer when viewed from above;

a fourth electrode located higher than an upper end of the third electrode, the fourth electrode being electrically connected to the second electrode and the third semiconductor layer; and a second insulating film located between the third electrode and the fourth electrode, between the third electrode and the first semiconductor layer, and between the third electrode and the second semiconductor layer.

Configuration 2

The device according to the configuration 1, wherein
an outer edge of the third electrode is positioned outward of an outer edge of the first insulating film when viewed from above,
the device further comprises a first conductive member,
the first conductive member extends from the second electrode through the third electrode toward the fourth electrode, and is electrically connected to the second and fourth electrodes, and
the second insulating film also is located between the third electrode and the first conductive member.

Configuration 3

The device according to the configuration 1 or 2, further comprising:
a second conductive member extending in the vertical direction,
the second conductive member being electrically connected to the third semiconductor layer and the fourth electrode.

Configuration 4

The device according to the configuration 3, wherein
a lower end of the second conductive member is positioned lower than a lower surface of the third semiconductor layer.

Configuration 5

The device according to any one of the configurations 1-4, wherein
the second semiconductor layer and the third semiconductor layer surround the first insulating film with the first semiconductor layer interposed when viewed from above.

Configuration 6

The device according to any one of the configurations 1-5, further comprising:
a third insulating film extending downward from the upper surface of the first semiconductor layer, the third insulating film being columnar;
a fifth electrode located in the third insulating film, the fifth electrode extending in the vertical direction, the fifth electrode being columnar;
a sixth electrode located higher than the upper surface of the first semiconductor layer, the sixth electrode overlapping a portion of the third insulating film, a portion of the first semiconductor layer, and a portion of the second semiconductor layer when viewed from above;

a first wiring member located between the third electrode and the sixth electrode, the first wiring member electrically connecting the third electrode and the sixth electrode; and a fourth insulating film located between the sixth electrode and the fourth electrode, between the sixth electrode and the first semiconductor layer, and between the sixth electrode and the second semiconductor layer.

Configuration 7

The device according to any one of the configurations 1-6, further comprising:
a fifth insulating film extending downward from the upper surface of the first semiconductor layer, the fifth insulating film being columnar;
a seventh electrode located in the fifth insulating film, the seventh electrode extending in the vertical direction, the seventh electrode being columnar;
an eighth electrode located higher than the upper surface of the first semiconductor layer, the eighth electrode overlapping a portion of the fifth insulating film, a portion of the first semiconductor layer, and a portion of the second semiconductor layer when viewed from above;
a second wiring member extending from the third electrode toward a termination region of the device, the second wiring member being electrically connected to the third electrode;
a third wiring member extending from the eighth electrode toward the termination region, the third wiring member being electrically connected to the eighth electrode;
a sixth insulating film located between the eighth electrode and the fourth electrode, between the eighth electrode and the first semiconductor layer, and between the eighth electrode and the second semiconductor layer; and
a fourth wiring member located above the second and third wiring members in the termination region, the fourth wiring member being electrically connected to the second and third wiring members.

Configuration 8

The device according to any one of the configurations 1-7, wherein
the second electrode is tubular with an opening at an upper end of the second electrode, and
an air layer exists inside the second electrode, or the device further comprises a seventh insulating film that is located inside the second electrode.

Configuration 9

A semiconductor device, comprising:
a first electrode;
a first semiconductor layer located on the first electrode, the first semiconductor layer being of a first conductivity type;
a first insulating film extending downward from an upper surface of the first semiconductor layer, the first insulating film being columnar;
a second semiconductor layer partially provided in an upper layer portion of the first semiconductor layer, the second semiconductor layer being next to the first insulating film with the first semiconductor layer interposed, the second semiconductor layer being of a second conductivity type;

a third semiconductor layer partially provided in an upper layer portion of the second semiconductor layer, the third semiconductor layer being of the first conductivity type;

a second electrode extending in a vertical direction, the second electrode including a first portion, the first portion being columnar, the first portion including an upper end portion that is not covered with the first insulating film, the first portion including a lower end portion that is located in the first insulating film, and a second portion linked to the upper end portion of the first portion, the second portion overlapping a portion of the first semiconductor layer and a portion of the second semiconductor layer when viewed from above;

a third electrode located higher than an upper end of the second portion, the third electrode being electrically connected to the third semiconductor layer; and a second insulating film located between the second portion and the third electrode, between the second portion and the first semiconductor layer, and between the second portion and the second semiconductor layer.

Configuration 10

The device according to the configuration 9, wherein
the first portion is tubular with an opening at an upper end of the first portion, and
an air layer exists inside the first portion, or the device further comprises third insulating film that is located inside the first portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
a first electrode;
a first semiconductor layer located on the first electrode, the first semiconductor layer being of a first conductivity type;
a first insulating film extending downward from an upper surface of the first semiconductor layer;
a second electrode located in the first insulating film, the second electrode extending in a vertical direction;
a second semiconductor layer partially provided in an upper layer portion of the first semiconductor layer, the second semiconductor layer being next to the first insulating film with the first semiconductor layer interposed, the second semiconductor layer being of a second conductivity type;
a third semiconductor layer partially provided in an upper layer portion of the second semiconductor layer, the third semiconductor layer being of the first conductivity type;
a third electrode located higher than the upper surface of the first semiconductor layer, the third electrode overlapping a portion of the first insulating film, a portion of the first semiconductor layer, and a portion of the second semiconductor layer when projected onto a plane perpendicular to a first direction from the first electrode to the first semiconductor layer;
a fourth electrode located higher than an upper end of the third electrode, the fourth electrode being electrically connected to the second electrode and the third semiconductor layer; and
a second insulating film located between the third electrode and the fourth electrode, between the third electrode and the first semiconductor layer, and between the third electrode and the second semiconductor layer, wherein
an outer edge of the third electrode is positioned outward of an outer edge of the first insulating film when projected onto the plane,
the device further comprises a first conductive member,
the first conductive member extends from the second electrode toward the fourth electrode, and is electrically connected to the second and fourth electrodes, and
the second insulating film also is located between the third electrode and the first conductive member.

2. The device according to claim 1, further comprising:
a second conductive member extending in the vertical direction,
the second conductive member being electrically connected to the third semiconductor layer and the fourth electrode.

3. The device according to claim 2, wherein
a lower end of the second conductive member is positioned lower than a lower surface of the third semiconductor layer.

4. The device according to claim 1, wherein
the second semiconductor layer and the third semiconductor layer surround the first insulating film with the first semiconductor layer interposed when projected onto the plane.

5. The device according to claim 1, further comprising:
a third insulating film extending downward from the upper surface of the first semiconductor layer;
a fifth electrode located in the third insulating film, the fifth electrode extending in the vertical direction;
a sixth electrode located higher than the upper surface of the first semiconductor layer, the sixth electrode overlapping a portion of the third insulating film, a portion of the first semiconductor layer, and a portion of the second semiconductor layer when projected onto the plane;
a first wiring member located between the third electrode and the sixth electrode, the first wiring member electrically connecting the third electrode and the sixth electrode; and
a fourth insulating film located between the sixth electrode and the fourth electrode, between the sixth electrode and the first semiconductor layer, and between the sixth electrode and the second semiconductor layer.

6. The device according to claim 1, further comprising:
a fifth insulating film extending downward from the upper surface of the first semiconductor layer;
a seventh electrode located in the fifth insulating film, the seventh electrode extending in the vertical direction;
an eighth electrode located higher than the upper surface of the first semiconductor layer, the eighth electrode overlapping a portion of the fifth insulating film, a portion of the first semiconductor layer, and a portion of the second semiconductor layer when projected onto the plane;
a second wiring member extending from the third electrode toward a termination region of the device, the second wiring member being electrically connected to the third electrode;
a third wiring member extending from the eighth electrode toward the termination region, the third wiring member being electrically connected to the eighth electrode;
a sixth insulating film located between the eighth electrode and the fourth electrode, between the eighth electrode and the first semiconductor layer, and between the eighth electrode and the second semiconductor layer; and
a fourth wiring member located above the second and third wiring members in the termination region, the fourth wiring member being electrically connected to the second and third wiring members.

7. The device according to claim 1, wherein
the second electrode is tubular with an opening at an upper end of the second electrode, and
an air layer exists inside the second electrode, or the device further comprises a seventh insulating film that is located inside the second electrode.

8. A semiconductor device, comprising:
a first electrode;
a first semiconductor layer located on the first electrode, the first semiconductor layer being of a first conductivity type;
a first insulating film extending downward from an upper surface of the first semiconductor layer;
a second semiconductor layer partially provided in an upper layer portion of the first semiconductor layer, the second semiconductor layer being next to the first insulating film with the first semiconductor layer interposed, the second semiconductor layer being of a second conductivity type;
a third semiconductor layer partially provided in an upper layer portion of the second semiconductor layer, the third semiconductor layer being of the first conductivity type;
a second electrode extending in a vertical direction, the second electrode including
a first portion, the first portion including an upper end portion, the first portion including a lower end portion that is located in the first insulating film, and
a second portion linked to the upper end portion of the first portion, the second portion overlapping a portion of the first semiconductor layer and a portion of the second semiconductor layer when projected onto the plane;
a third electrode located higher than an upper end of the second portion, the third electrode being electrically connected to the third semiconductor layer; and
a second insulating film located between the second portion and the third electrode, between the second portion and the first semiconductor layer, and between the second portion and the second semiconductor layer, wherein
the first semiconductor layer is in direct contact with the first insulating film and the second insulating film.

9. The device according to claim 8, wherein
the first portion is tubular with an opening at an upper end of the first portion, and
an air layer exists inside the first portion, or the device further comprises third insulating film that is located inside the first portion.

* * * * *